United States Patent
Ahn et al.

(10) Patent No.: US 8,872,298 B2
(45) Date of Patent: Oct. 28, 2014

(54) UNIT PIXEL ARRAY OF AN IMAGE SENSOR

(75) Inventors: Jung-Chak Ahn, Yongin-si (KR); Kyung-Ho Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 530 days.

(21) Appl. No.: 13/173,053

(22) Filed: Jun. 30, 2011

(65) Prior Publication Data

US 2012/0001289 A1     Jan. 5, 2012

(30) Foreign Application Priority Data

Jul. 1, 2010  (KR) .................. 10-2010-0063344
Jan. 11, 2011 (KR) .................. 10-2011-0002746

(51) Int. Cl.
*H01L 31/0232* (2014.01)
*H01L 27/146* (2006.01)

(52) U.S. Cl.
CPC ..... *H01L 27/14621* (2013.01); *H01L 27/14685* (2013.01); *H01L 27/14645* (2013.01); *H01L 27/1462* (2013.01); *H01L 27/14609* (2013.01); *H01L 27/14627* (2013.01)
USPC ............. 257/440; 257/E27.134; 257/E31.121

(58) Field of Classification Search
None
See application file for complete search history.

(56) References Cited

U.S. PATENT DOCUMENTS 5,990,506 A * 11/1999 Fossum et al. ................ 257/294
6,281,561 B1    8/2001 Stiebig et al.
2009/0302407 A1* 12/2009 Gidon et al. .................. 257/432

FOREIGN PATENT DOCUMENTS

| JP | 2005-115208 A | 4/2005 |
| JP | 2008-147749 A | 6/2008 |
| JP | 2008-258474 A | 10/2008 |
| JP | 2009-170539 A | 7/2009 |
| JP | 2009-277732 A | 11/2009 |

* cited by examiner

*Primary Examiner* — Wensing Kuo
(74) *Attorney, Agent, or Firm* — Lee & Morse, P.C.

(57) ABSTRACT

A unit pixel array of an image sensor includes a semiconductor substrate having a plurality of photodiodes, an interlayer insulation layer on a front-side of the semiconductor substrate, and a plurality of micro lenses on a back-side of the semiconductor substrate. The unit pixel array of the image sensor further includes a wavelength adjustment film portion between each of the micro lenses and the back-side of the semiconductor substrate such that a plurality of wavelength adjustment film portions correspond with the plurality of micro lenses.

18 Claims, 18 Drawing Sheets

UNIT PIXEL ARRAY OF AN IMAGE SENSOR

CROSS-REFERENCE TO RELATED APPLICATIONS

Korean Patent Application No. 10-2010-0063344, filed on Jul. 1, 2010, and Korean Patent Application No. 10-2011-0002746, filed on Jan. 11, 2011, in the Korean Intellectual Property Office, are incorporated by reference herein in their entireties.

BACKGROUND

An image sensor, e.g., a complementary metal oxide semiconductor (CMOS) image sensor, may receive incident light, may convert the incident light into electric charges, and may output an electrical signal corresponding to the electric charges.

SUMMARY

Embodiments may be realized by providing a unit pixel array of an image sensor that includes a semiconductor substrate having a plurality of photodiodes, an interlayer insulation layer on a front-side of the semiconductor substrate, a plurality of micro lenses on a back-side of the semiconductor substrate, and a wavelength adjustment film portion between each of the micro lenses and the back-side of the semiconductor substrate such that a plurality of wavelength adjustment film portions correspond with the plurality of micro lenses.

The unit pixel array may include a plurality of color filters. The color filters may be the plurality of wavelength adjustment film portions and the plurality of micro lenses may be on the color filters. The plurality of wavelength adjustment film portions may adjust wavelengths of incident light filtered by the color filters.

The wavelength adjustment film portions may include at least one first wavelength adjustment portion having a wavelength increasing material that increases the wavelengths of incident light filtered by the color filters, at least one second wavelength adjustment portion having a wavelength decreasing material that decreases the wavelengths of incident light filtered by the color filters, and at least one third wavelength adjustment portion having a wavelength maintaining material that maintains the wavelengths of incident light filtered the color filters.

The plurality of color filters may include at least one red filter, at least one green filter, and at least one blue filter. The blue filter may be on the first wavelength adjustment portion, the red filter may be on the second wavelength adjustment portion, and the green filter may be on the third wavelength adjustment portion.

The plurality of color filters may include at least one yellow filter, at least one cyan filter, and at least one magenta filter. The magenta filter may be on the first wavelength adjustment portion, the yellow filter may be on the second wavelength adjustment portion, and the cyan filter may be on the third wavelength adjustment portion.

The blue filter may be formed on the first wavelength adjustment portion, the red filter may be formed on the second wavelength adjustment portion, and the green filter may be formed on the third wavelength adjustment portion.

The color filters may include at least one yellow filter, at least one cyan filter, and at least one magenta filter. The magenta filter may be on the first wavelength adjustment portion, the yellow filter may be on the second wavelength adjustment portion, and the cyan filter may be on the third wavelength adjustment portion.

The plurality of wavelength adjustment film portions may be wavelength adjustment color filters on the back side of the semiconductor substrate. The plurality of micro lenses may be on the wavelength adjustment color filters.

The wavelength adjustment color filters may include wavelength adjustment materials that adjust wavelengths of incident light.

The wavelength adjustment color filters may include at least one first wavelength adjustment color filter having a wavelength increasing material that increases the wavelengths of incident light, at least one second wavelength adjustment color filter having a wavelength decreasing material that decreases the wavelengths of incident light, and at least one third wavelength adjustment color filter having a wavelength maintaining material that maintains the wavelengths of incident light.

The first wavelength adjustment color filter may correspond to a blue filter, the second wavelength adjustment color filter may correspond to a red filter, and the third wavelength adjustment color filter may correspond to a green filter. The first wavelength adjustment color filter may correspond to a magenta filter, the second wavelength adjustment color filter may correspond to a yellow filter, and the third wavelength adjustment color filter may correspond to a cyan filter.

Embodiments may also be realized by providing a unit pixel array of an image sensor that includes a semiconductor substrate having a plurality of photodiodes, an interlayer insulation layer on a front-side of the semiconductor substrate, a plurality of wavelength selection color filters on a back-side of the semiconductor substrate, and a plurality of micro lenses on the plurality of wavelength selection color filters. The wavelength selection color filters being capable of selectively allowing incident light having different wavelengths to pass therethrough based on a bias voltage.

The plurality of wavelength selection color filters may allow blue light having a relatively short wavelength to pass therethrough when a first bias voltage is applied to the wavelength selection color filters. The plurality of wavelength selection color filters may allow green light having a relatively medium wavelength to pass therethrough when a second bias voltage is applied to the wavelength selection color filters. The plurality of wavelength selection color filters may allow red light having a relatively long wavelength pass therethrough when a third bias voltage is applied to the wavelength selection color filters.

The plurality of wavelength selection color filters may operate as a plurality of blue filters or a plurality of magenta filters when the first bias voltage is applied to the wavelength selection color filters. The plurality of wavelength selection color filters may operate as a plurality of green filters or a plurality of cyan filters when the second bias voltage is applied to the wavelength selection color filters. The plurality of wavelength selection color filters may operate as a plurality of red filters or a plurality of yellow filters when the third bias voltage is applied to the wavelength selection color filters. The bias voltage may be applied to the plurality of wavelength selection color filters via a plurality of electrodes coupled to the wavelength selection color filters, respectively.

Embodiments may also be realized by providing an image sensing system that includes an image sensor. The image sensing system includes a semiconductor substrate having a plurality of photodiodes of the image sensor, an interlayer insulation layer on a front-side of the semiconductor substrate, a plurality of micro lenses of the image sensor on a back-side of the semiconductor substrate, the micro lenses facing an outside of the image sensing system, and a wavelength adjustment film portion between each of the micro lenses and the back-side of the semiconductor substrate such that a plurality of wavelength adjustment film portions correspond with the plurality of micro lenses. The wavelength adjustment film portions adjust wavelengths of incident light input therein from the outside of the image sensing system, wherein the wavelength adjustment film portions include a plurality of first wavelength adjustment portions having a wavelength increasing material that increases the wavelengths of incident light input therein from the outside of the image sensing system, a plurality of second wavelength adjustment portions having a wavelength decreasing material that decreases the wavelengths of incident light input therein from the outside of the image sensing system, and a plurality of third wavelength adjustment portions having a wavelength maintaining material that maintains the wavelengths of incident light input therein from the outside of the image sensing system.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
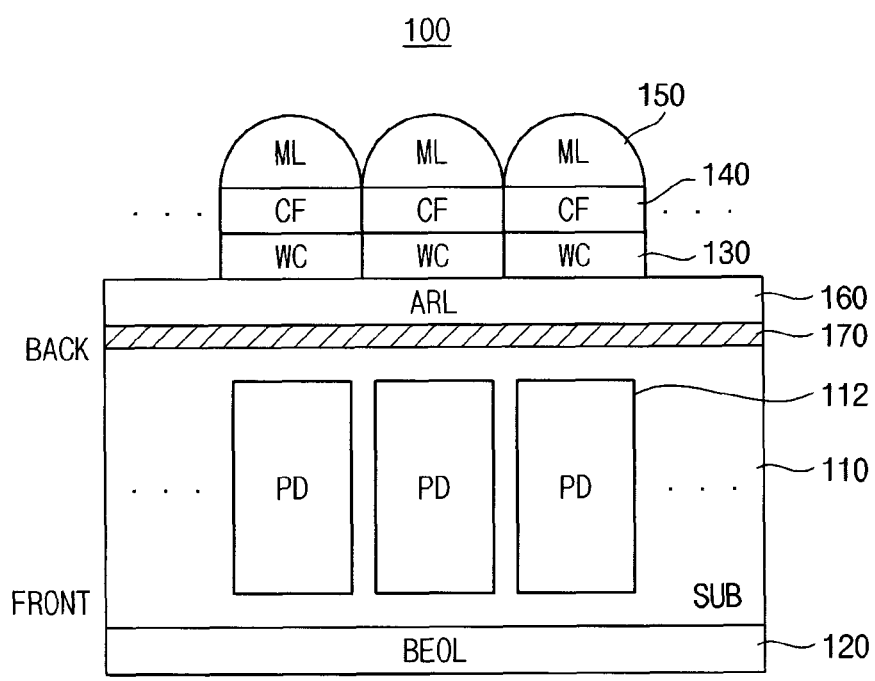
FIG. 1 illustrates a cross-sectional view of a unit pixel array of an image sensor, according to an exemplary embodiment.

Korean Patent Application No. 10-2010-0063344, filed on Jul. 1, 2010, and Korean Patent Application No. 10-2011-0002746, filed on Jan. 11, 2011, in the Korean Intellectual Property Office, are incorporated by reference herein in their entireties.

Various exemplary embodiments will be described more fully hereinafter with reference to the accompanying drawings; however, they may be embodied in many different forms and should not be construed as limited to the example embodiments set forth herein. Rather, these example embodiments are provided so that this disclosure will be thorough and complete, and will fully convey the scope of the inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings. As used herein, the term "and/or" includes any and all combinations of one or more of the associated listed items.

It will be understood that when an element is referred to as being "connected" or "coupled" to another element, it can be directly connected or coupled to the other element or intervening elements may be present. When an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a cross-sectional view of a unit pixel array of an image sensor, according to an exemplary embodiment.

Referring to FIG. 1, a unit pixel array 100 of an image sensor may include a semiconductor substrate 110, an interlayer insulation layer 120 (e.g., a back end of line BEOL), a wavelength adjustment layer 130, a plurality of color filters 140, and a plurality of micro lenses 150. Here, the image sensor may be a complementary metal oxide semiconductor (CMOS) image sensor. According to exemplary embodiments, the unit pixel array 100 may further include a first anti-reflection layer 160 between a back-side BACK of the semiconductor substrate 110 and the wavelength adjustment layer 130, and/or a second anti-reflection layer (not illustrated) between a front-side FRONT of the semiconductor substrate 110 and the interlayer insulation layer 120. As illustrated in FIG. 1, in the unit pixel array 100, incident light may sequentially pass through the micro lenses 150, the color filters 140, the wavelength adjustment layer 130, and the back-side BACK of the semiconductor substrate 110. The micro lenses 150, the color filters 140, and the wavelength adjustment layers 130 may be arranged to correspond to each other. For example, each wavelength adjustment layer 130 may correspond to one micro lens 150 and one color filter 140. The CMOS image sensor having the unit pixel array 100 of FIG. 1 may be referred to as a back-side illumination CMOS image sensor (BIS).

The semiconductor substrate 110 may include a plurality of photodiodes 112 that convert incident light into electric charges. The semiconductor substrate 110 may be, e.g., (p)-type epitaxial substrate. The photodiodes 112 may be formed by implanting (n)-type ions into the semiconductor substrate 110. The photodiodes 112 corresponding to a plurality of unit pixels may be arranged in matrix manner in the unit pixel array 100. For example, each photodiode 112 may correspond to one color filter 140 such that the photodiodes 112 correspond to the color filters 140. As described above, the CMOS image sensor having the unit pixel array 100 of FIG. 1 may be referred to as a back-side illumination CMOS image sensor. In a front-side illumination CMOS image sensor, incident light may illuminate a front-side of a semiconductor substrate. Thus, incident light may be reflected by obstacles such as multiple-layer metal wirings formed in an interlayer insulation layer.

In addition, an optical crosstalk may occur among a plurality of photodiodes in the front-side illumination CMOS image sensor. As a result, the front-side illumination CMOS image sensor may have low sensing performance, e.g., light-reception efficiency and light sensitivity). Accordingly, a back-side illumination CMOS image sensor has been suggested. However, in the back-side illumination CMOS image sensor, noise may occur due to surface defects that exist, e.g., surface defects caused by a manufacturing process, in an interface region 170 of the semiconductor substrate 110.

In the manufacturing process of the back-side illumination CMOS image sensor, a grinding process may be performed on the back-side BACK of the semiconductor substrate 110 in order to, e.g., decrease the thickness of the semiconductor substrate 110. Surface defects, e.g., dangling bonds, may be caused on the back-side BACK of the semiconductor substrate 110 during the grinding process. That is, the surface defects may exist in the interface region 170 of the semiconductor substrate 110. Further, the surface defects may thermally generate electric charges without any incident light. As a result, dark currents may be generated by the surface defects in the back-side illumination CMOS image sensor. The dark currents may be displayed on a display screen as a plurality of white spots.

In the manufacturing process of the back-side illumination CMOS image sensor, it may not be possible to perform a high temperature heat treatment in order to eliminate the surface defects of the interface region 170 because such a process on the back-side BACK of the semiconductor substrate 110 may be performed after the interlayer insulation layer 120 having multiple-layer metal wirings is formed on the front-side FRONT of the semiconductor substrate 110. As such, in order to passivate the surface defects, a plurality of (p)-type impurities may be heavily doped into the interface region 170. However, the surface defects may not be perfectly passivated in the interface region 170.

The interlayer insulation layer 120 may be formed on the front-side FRONT of the semiconductor substrate 110. One unit pixel may include a photodiode 112 that converts incident light into electric charges, and a signal generation circuit having a plurality of transistors (not illustrated) that generate an electrical signal corresponding to the electric charges. As described above, the interlayer insulation layer 120 may include gate electrodes of the transistors and the multiple-layer metal wirings. In some exemplary embodiments, a second anti-reflection layer may be placed between the semiconductor substrate 110 and the interlayer insulation layer 120. The second anti-reflection layer may reduce and/or prevent incident light passing through one photodiode 112 from being reflected by the interlayer insulation layer 120, e.g., near the front-side FRONT of the semiconductor substrate 110. Namely, the second anti-reflection layer may reduce and/or prevent incident light passing through one photodiode 112 from being received by other photodiodes 112 after being reflected by the interlayer insulation layer 120.

Accordingly, the unit pixel array 100 of FIG. 1 may reduce an optical crosstalk among adjacent photodiodes 112, so that an image sensor having the unit pixel array 100 of FIG. 1 may not generate a ghost image.

The wavelength adjustment layer 130 may be formed on the back-side BACK of the semiconductor substrate 110. The wavelength adjustment layer 130 may include therein a wavelength adjustment film that is configured to adjust the wavelength of light, and the wavelength adjustment film may include a plurality of wavelength adjustment film portions. The wavelength adjustment layer 130, e.g., the wavelength adjustment film of the wavelength adjustment layer 130, may include a plurality of wavelength adjustment portions for adjusting wavelength of light filtered by the color filters 140. Each of the wavelength adjustment portions may contain a wavelength adjustment material for adjusting wavelength of light filtered by the color filters 140. The wavelength adjustment material may be a material, e.g., an organic material, an inorganic material, etc., that receives light of a first wavelength region, and that outputs light of a second wavelength region that is different from light of the first wavelength region.

In exemplary embodiments, the wavelength adjustment layer 130 may include at least one first wavelength adjustment portion, at least one second wavelength adjustment portion, and at least one third wavelength adjustment portion. The first wavelength adjustment portion may contain a wavelength increasing material for increasing a wavelength of incident light filtered by the color filters 140. The second wavelength adjustment portion may contain a wavelength decreasing material for decreasing a wavelength of incident light filtered by the color filters 140. The third wavelength adjustment portion may contain a wavelength maintaining material for maintaining a wavelength of incident light filtered by the color filters 140. The first, second and third wavelength adjustment portions may be disposed in various arrangements relative to each other, e.g., the second wavelength adjustment portion may be between the first and third wavelength adjustment portions, or the third wavelength adjustment portion may be between the first and second wavelength adjustment portions.

The wavelength adjustment layer 130 may increase a wavelength of incident light filtered by the color filters 140 when incident light filtered by the color filters 140 has a relatively short wavelength, may decrease a wavelength of incident light filtered by the color filters 140 when incident light filtered by the color filters 140 has a relatively long wavelength, and may maintain a wavelength of incident light filtered by the color filters 140 when incident light filtered by the color filters 140 has a relatively medium wavelength. As extinction coefficient of light may differ according to its wavelength, incident light filtered by different color filters 140 may be absorbed at different positions, i.e., at different depths, in the semiconductor substrate 110. For example, blue light, e.g., incident light filtered by a blue filter, having a relatively short wavelength of about 450 nm may be mostly absorbed at an upper region of the photodiode 112. Green light, e.g., incident light filtered by a green filter, having a relatively medium wavelength of about 550 nm may be mostly absorbed at a center region of the photodiode 112. Red light, e.g., incident light filtered by a red filter, having a relatively long wavelength of about 650 nm may be mostly absorbed at a lower region of the photodiode 112. Thus, in the unit pixel array 100, the wavelength adjustment layer 130 may adjust, e.g., change, wavelengths of incident light filtered by the color filters 140 such that incident light filtered by the color filters 140 may not be absorbed at a region near the back-side BACK of the semiconductor substrate 110 and a region near the front-side FRONT of the semiconductor substrate 110.

In one exemplary embodiment, the color filters 140 may include at least one red filter, at least one green filter, and at least one blue filter. In this case, the first wavelength adjustment portion may be placed under the blue filter, the second wavelength adjustment portion may be placed under the red filter, and the third wavelength adjustment portion may be placed under the green filter. Hence, the first wavelength adjustment portion may increase a wavelength of incident light filtered by the blue filter, the second wavelength adjustment portion may decrease a wavelength of incident light filtered by the red filter, and the third wavelength adjustment portion may maintain a wavelength of incident light filtered by the green filter. This is because blue light has a relatively short wavelength, red light has a relatively long wavelength, and green light has a relatively medium wavelength. As described above, in the unit pixel array 100, the wavelength adjustment layer 130 may adjust wavelengths of incident light, e.g., blue light, red light, and green light, filtered by the color filters 140 such that incident light filtered by the color filters 140 may be mostly absorbed at a region the semiconductor substrate 110 having the photodiode 112 placed therein, e.g., near the center of the semiconductor substrate 110.

In another exemplary embodiment, the color filters 140 may include at least one magenta filter, at least one cyan filter, and at least one yellow filter. In this case, the first wavelength adjustment portion may be placed under the magenta filter, the second wavelength adjustment portion may be placed under the yellow filter, and the third wavelength adjustment portion may be placed under the cyan filter. Hence, the first wavelength adjustment portion may increase a wavelength of incident light filtered by the magenta filter, the second wavelength adjustment portion may decrease a wavelength of incident light filtered by the yellow filter, and the third wavelength adjustment portion may maintain a wavelength of incident light filtered by the cyan filter. This is because magenta light has a relatively short wavelength, yellow light has a relatively long wavelength, and cyan light has a relatively medium wavelength. As described above, in the unit pixel array 100, the wavelength adjustment layer 130 may adjust wavelengths of incident light, e.g., magenta light, yellow light, and cyan light, filtered by the color filters 140 such that incident light filtered by the color filters 140 may be mostly absorbed at region the semiconductor substrate 110 having the photodiode 112 placed therein, e.g., near the center of the semiconductor substrate 110.

The color filters 140 may be formed on, e.g., directly on, the wavelength adjustment layer 130. Each of the color filters 140 may be formed on one of the first wavelength adjustment portion having the wavelength increasing material, the second wavelength adjustment portion having the wavelength decreasing material, and the third wavelength adjustment portion having the wavelength maintaining material.

An image sensor, e.g., a back-side illumination CMOS image sensor, may employ various pattern techniques, e.g., a Bayer pattern technique, that uses a plurality of color filters. The color filters 140 may include a set of at least one red filter, at least one green filter, and at least one blue filter, or a set of at least one yellow filter, at least one magenta filter, and at least one cyan filter. In one exemplary embodiment, the blue filter may be formed on the first wavelength adjustment portion, the red filter may be formed on the second wavelength adjustment portion, and the green filter may be formed on the third wavelength adjustment portion. In another exemplary embodiment, the magenta filter may be formed on the first wavelength adjustment portion, the yellow filter may be formed on the second wavelength adjustment portion, and the cyan filter may be formed on the third wavelength adjustment portion. The micro lenses 150 may be formed on, e.g., directly on, the color filters 140. The micro lenses 150 may concentrate incident light input from outside. The micro lenses 150 may face outside, e.g., an outside of an image sensing system.

According to some exemplary embodiments, the unit pixel array 100 may further include the first anti-reflection layer 160. The first anti-reflection layer 160 may be placed between the back-side BACK of the semiconductor substrate 110 and the wavelength adjustment layer 130. As described above, incident light may sequentially pass through the micro lenses 150, the color filters 140, the wavelength adjustment layer 130, and the back-side BACK of the semiconductor substrate 110. The first anti-reflection layer 160 may reduce and/or prevent incident light from being reflected by the back-side BACK of the semiconductor substrate 110. As a result, the first anti-reflection layer 160 may allow incident light to be efficiently penetrated into the semiconductor substrate 110. The first anti-reflection layer 160 may improve sensing performance, e.g., light-reception efficiency and light sensitivity, of an image sensor. For example, the first anti-reflection layer 160 may be formed by laminating a plurality of materials having different refractive indexes on the back-side BACK of the semiconductor substrate 110.

The thickness of the semiconductor substrate 110 may be gradually decreased as smaller electric devices are manufactured. Nevertheless, sensing performance, e.g., light-reception efficiency and light sensitivity, of an image sensor should be improved. As described above, the unit pixel array 100 may include the wavelength adjustment layer 130. Furthermore, the wavelength adjustment layer 130 may increase a wavelength of incident light filtered by the color filters 140 when incident light filtered by the color filters 140 has a relatively short wavelength, may decrease a wavelength of incident light filtered by the color filters 140 when incident light filtered by the color filters 140 has a relatively long wavelength, and may maintain a wavelength of incident light filtered by the color filters 140 when incident light filtered by the color filters 140 has a relatively medium wavelength. As a result, the unit pixel array 100 may reduce and/or prevent incident light filtered by the color filters from being absorbed near the back-side BACK of the semiconductor substrate 110 and near the front-side FRONT of the semiconductor substrate 110. Hence, the photodiode 112 that is placed at a center region of the semiconductor substrate 110 may efficiently absorb incident light filtered by the color filters 140. Therefore, sensing performance, e.g., light-reception efficiency and light sensitivity, of an image sensor having the unit pixel array 100 may be greatly improved.

FIGS. 2A through 2F illustrate cross-sectional views of an exemplary process of manufacturing a unit pixel array of FIG. 1.

Figure 2A:
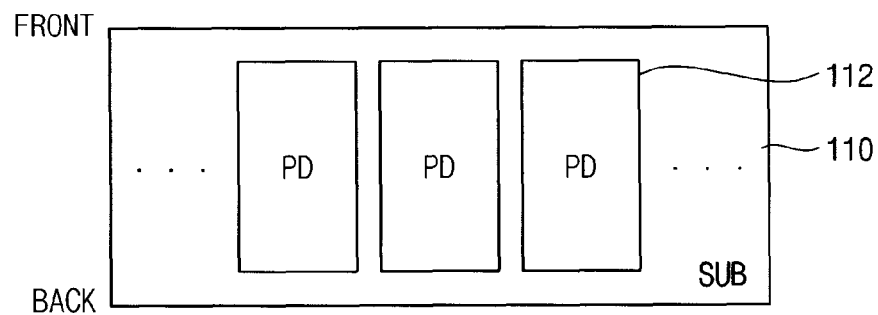
FIGS. 2A through 2F illustrate cross-sectional views of an exemplary process of manufacturing a unit pixel array of FIG. 1.

Referring to FIG. 2A, the photodiodes 112 may be formed in the semiconductor substrate 110. In some exemplary embodiments, the semiconductor substrate 110 may be the (p)-type epitaxial substrate. For example, the semiconductor substrate 110 may be manufactured by forming a (p)-type epitaxial layer on a (p)-type bulk silicon substrate. A unit pixel may transform incident light to electric charges, and may generate an electrical signal corresponding to the electric charges. For these operations, the unit pixel may include the photodiode 112 and a plurality of transistors (not illustrated). The unit pixel may have a structure including at least one transistor, e.g., the unit pixel may have a one-transistor structure, a three-transistor structure, a four-transistor structure, or a five-transistor structure. For example, when the unit pixel has the five-transistor structure, the unit pixel may include a reset transistor, a source follower transistor, a select transistor, a transfer transistor, and a bias transistor. For convenience of descriptions, the transistors of the unit pixel are omitted in FIGS. 2A through 2F.

The photodiodes 112 may be arranged in the semiconductor substrate 110 in a matrix manner. For example, the photodiodes 112 may be formed by performing an ion-implantation process. The photodiodes 112 may be a (n)-type region formed in the (p)-type epitaxial layer of the semiconductor substrate 110. In some exemplary embodiments, the photodiodes 112 may be formed by laminating a plurality of doped regions. In this case, an upper doped region may be (n+)-type region that is formed by implanting (n+)-type ions in the p-type epitaxial layer of the semiconductor substrate 110, and a lower doped region may be (n−)-type region that is formed by implanting (n−)-type ions in the p-type epitaxial layer of the semiconductor substrate 110. In some exemplary embodiments, element isolation regions may be formed among a plurality of unit pixels. The element isolation regions may be formed using a field oxide (FOX) by a shallow trench isolation (STI) process or a local oxidation of silicon (LOCOS) process.

Figure 2B:
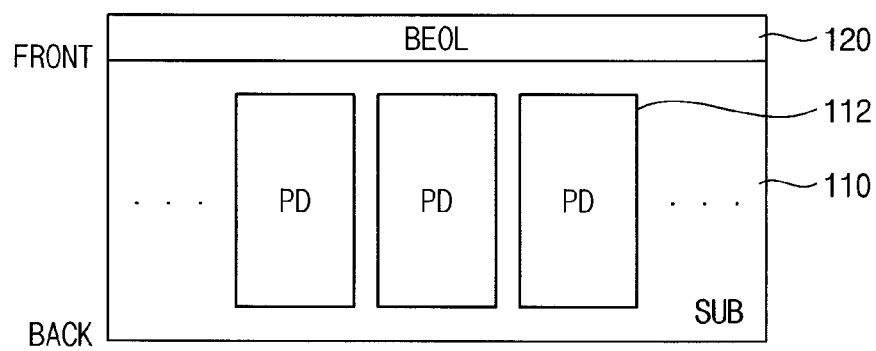

Referring to FIG. 2B, the interlayer insulation layer 120 may be formed on the front-side FRONT of the semiconductor substrate 110. The interlayer insulation layer 120 may include gate electrodes of the transistors and/or the multi-layer metal wirings. The interlayer insulation layer 120 may be formed by a material having good gap-fill characteristics. For example, the material having good gap-fill characteristics may be a high density plasma (HDP), a tonen silazene (TOSZ), a spin on glass (SOG), a undoped silica glass (USG), or combinations thereof. In some exemplary embodiments, the gate electrodes included in the interlayer insulation layer 120 may be formed by laminating a gate insulation layer and a gate conductive layer on the front-side FRONT of the semiconductor substrate 110, and by patterning the gate insulation layer and the gate conductive layer laminated on the front-side FRONT of the semiconductor substrate 110. The multi-layer metal wirings included in the interlayer insulation layer 120 may be formed by patterning a conductive material having a metal such as copper, aluminum, etc. In some exemplary embodiments, a protective layer (not illustrated) for protecting elements may be formed on the interlayer insulation layer 120.

Figure 2C:
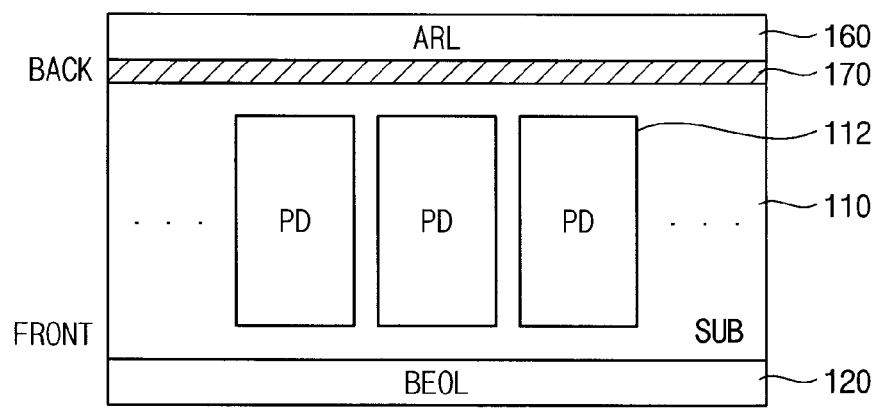

Referring to FIG. 2C, a plurality of (p)-type impurities may be heavily doped into the interface region 170 in order to, e.g., passivate the surface defects such as dangling bonds after a grinding process is performed on the back-side BACK of the semiconductor substrate 110. The interface region 170 may correspond to a heavily doped region of (p)-type impurities for passivating the surface defects. The interface region 170 having the (p)-type impurities may have conductive characteristics. The grinding process may be performed on the back-side BACK of the semiconductor substrate 110 by a mechanical process and/or a chemical process. For example, the mechanical process may be performed by rubbing a polishing pad on the back-side BACK of the semiconductor substrate 110. In addition, the chemical process may be performed by injecting chemical materials such as "slurry" between a polishing pad and the back-side BACK of the semiconductor substrate 110. Then, the first anti-reflection layer 160 may be formed on the back-side BACK of the semiconductor substrate 110. As described above, the first anti-reflection layer 160 may be formed by laminating a plurality of materials having different refractive indexes. However, the first anti-reflection layer 160 may not be formed in the unit pixel array 100.

Figure 2D:
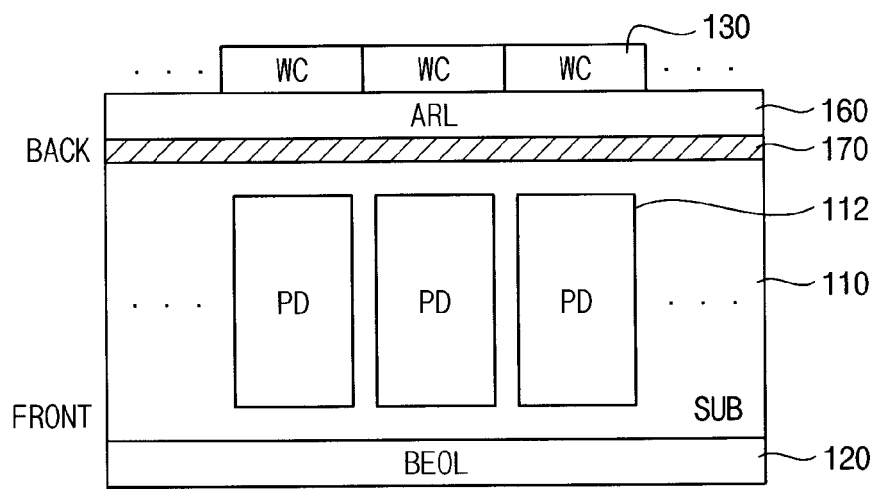

Referring to FIG. 2D, the wavelength adjustment layer 130 may be formed on the back-side BACK of the semiconductor substrate 110, e.g., on the first anti-reflection layer 160). As described above, the wavelength adjustment layer 130 may adjust a wavelength of incident light filtered by the color filters 140 formed on the wavelength adjustment layer 130. For these operations, the wavelength adjustment layer 130 may include a plurality of wavelength adjustment portions of which each contains a wavelength adjustment material. The wavelength adjustment material may be a material, e.g., an organic material, an inorganic material, etc, that receives light of a first wavelength region, and that outputs light of a second wavelength region that is different from light of the first wavelength region. In detail, the wavelength adjustment layer 130 may include at least one first wavelength adjustment portion, at least one second wavelength adjustment portion, and at least one third wavelength adjustment portion. The first wavelength adjustment portion may contain a wavelength increasing material for increasing a wavelength of incident light filtered by the color filters 140. The second wavelength adjustment portion may contain a wavelength decreasing material for decreasing a wavelength of incident light filtered by the color filters 140. The third wavelength adjustment portion may contain a wavelength maintaining material for maintaining a wavelength of incident light filtered by the color filters 140.

Figure 2E:
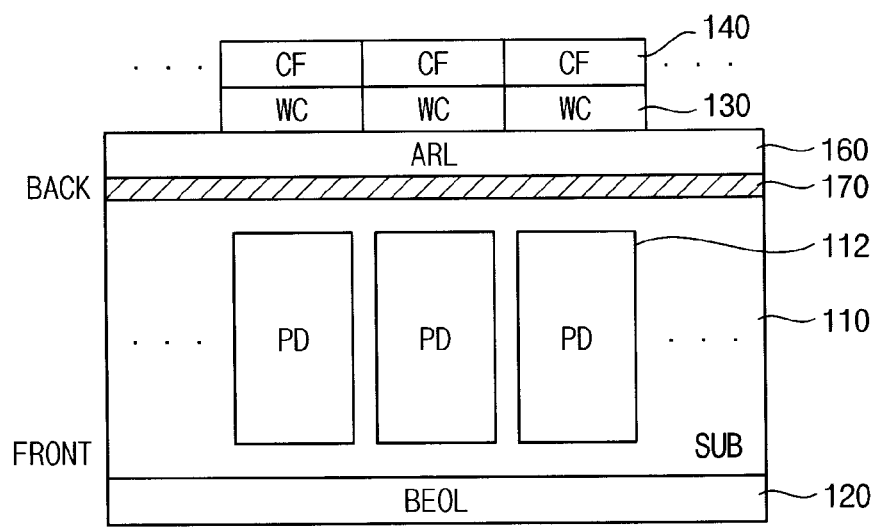

Referring to FIG. 2E, the color filters 140 may be formed on the wavelength adjustment layer 130. The color filters 140 may be placed on corresponding wavelength adjustment portions of the wavelength adjustment layer 130. For example, the color filter 140 that incident light having a relatively short wavelength passes through may be placed on the first wavelength adjustment portion having the wavelength increasing material. The color filter 140 that incident light having a relatively long wavelength passes through may be placed on the second wavelength adjustment portion having the wavelength decreasing material. The color filter 140 that incident light having a relatively medium wavelength passes through may be placed on the third wavelength adjustment portion having the wavelength maintaining material. In one exemplary embodiment, the color filters 140 may include at least one red filter, at least one green filter, and at least one blue filter. In this case, the blue filter may be formed on, e.g., directly on, the first wavelength adjustment portion, the red filter may be formed on, e.g., directly on, the second wavelength adjustment portion, and the green filter may be formed on, e.g., directly on, the third wavelength adjustment portion. In another exemplary embodiment, the color filters 140 may include at least one magenta filter, at least one yellow filter, and at least one cyan filter. In this case, the magenta filter may be formed on, e.g., directly on, the first wavelength adjustment portion, the yellow filter may be formed on, e.g., directly on, the second wavelength adjustment portion, and the cyan filter may be formed on, e.g., directly on, the third wavelength adjustment portion. The color filters 140 may be formed by coating the back-side BACK of the semiconductor substrate 110 with a photosensitive material, e.g., a photo-resist, and by patterning the photosensitivity material, e.g., by performing a photolithography and lithography process using masks. In some exemplary embodiments, a flat layer, e.g., an overcoating layer, may be coated on the color filters 140.

Figure 2F:
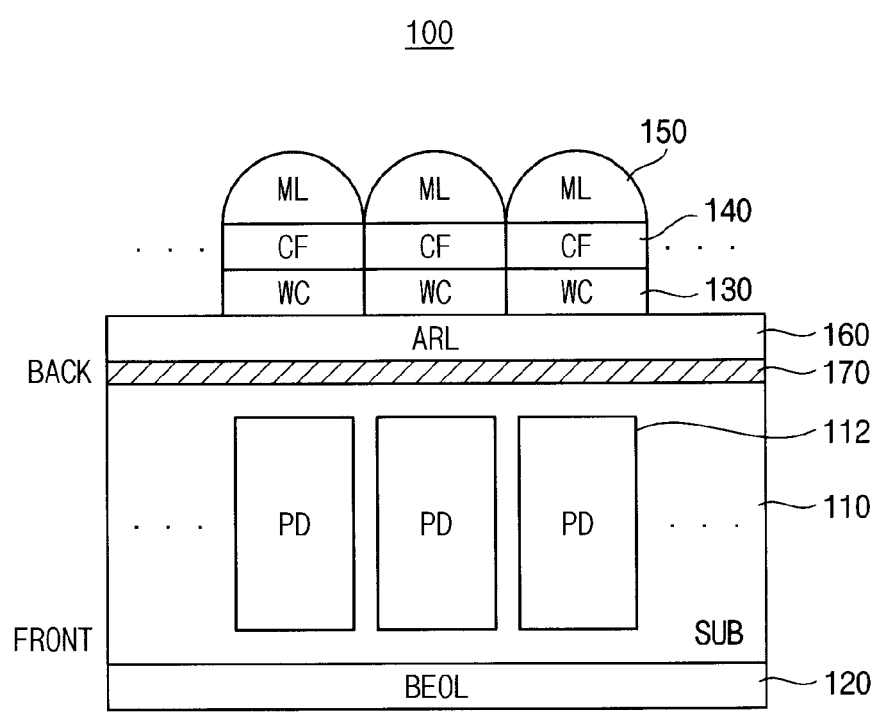

Referring to FIG. 2F, the micro lenses 150 may be formed on the color filters 140. For example, the micro lenses 150 may be formed on, e.g., directly on, each color filter 140. The micro lenses 150 may correspond to the color filters 140, e.g., one micro lens 150 may correspond to one color filter 140. In some exemplary embodiments, the micro lenses 150 may be formed by generating a plurality of patterns using a beam penetration photo-resist, and by performing a reflow process for the plurality of patterns.

Since a manufacturing process of the unit pixel array 100 illustrated in FIGS. 2A through 2F is exemplary, the manufacturing process of the unit pixel array 100 is not limited thereto. As described above, in the unit pixel array 100, the wavelength adjustment layer 130 may increase a wavelength of incident light filtered by the color filters 140 when incident light filtered by the color filters 140 has a relatively short wavelength, may decrease a wavelength of incident light filtered by the color filters 140 when incident light filtered by the color filters 140 has a relatively long wavelength, and may maintain a wavelength of incident light filtered by the color filters 140 when incident light filtered by the color filters 140 has a relatively medium wavelength. Thus, the unit pixel array 100 may reduce and/or prevent incident light filtered by the color filters from being absorbed near the back-side BACK of the semiconductor substrate 110 and from being absorbed near the front-side FRONT of the semiconductor substrate 110. Hence, the photodiode 112 that is placed at the center region of the semiconductor substrate 110, may efficiently absorb incident light filtered by the color filters 140. Therefore, sensing performance, e.g., light-reception efficiency and light sensitivity, of an image sensor having the unit pixel array 100 may be greatly improved.

Figure 3:
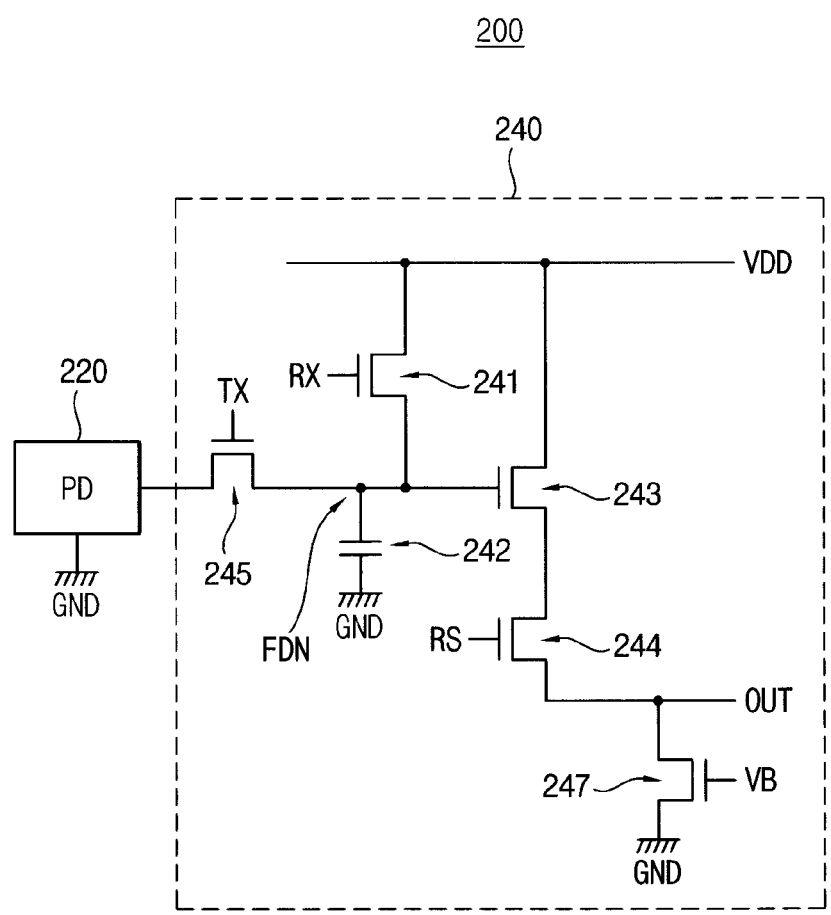
FIG. 3 illustrates a block diagram of one unit pixel in a unit pixel array of FIG. 1, according to an exemplary embodiment.

FIG. 3 illustrates a block diagram of one unit pixel in a unit pixel array of FIG. 1, according to an exemplary embodiment.

Referring to FIG. 3, the unit pixel 200 may include the photodiode 220 and the signal generation circuit 240. The signal generation circuit 240 may include a capacitor 242 and a plurality of transistors 241, 243, 244, 245, and 247. As described above, the unit pixel 200 may have the one-transistor structure, the three-transistor structure, the four-transistor structure, or the five-transistor structure according to the number of transistors. As illustrated in FIG. 3, the unit pixel 200 may have the five-transistor structure. In this case, the five-structure may include a reset transistor 241, a source follower transistor 243, a select transistor 244, a transfer transistor 245, and a bias-transistor 247. A floating diffusion node FDN may be formed by a capacitor 242.

In the reset transistor 241, a gate terminal of the reset transistor 241 may receive a reset signal RX, a first terminal of the reset transistor 241 may be coupled to the floating diffusion node FDN, and a second terminal of the reset transistor 241 may be coupled to a power voltage VDD. In the source follower transistor 243, a gate terminal of the source follower transistor 243 may be coupled to the floating diffusion node FDN, a first terminal of the source follower transistor 243 may be coupled to a second terminal of the select transistor 244, and a second terminal of the source follower transistor 243 may be coupled to the power voltage VDD. In the select transistor 244, a gate terminal of the select transistor 244 may receive a row selection signal RS, a first terminal of the select transistor 244 may be coupled to an output terminal OUT, and the second terminal of the select transistor 244 may be coupled to the first terminal of the source follower transistor 243. In the transfer transistor 245, a gate terminal of the transfer transistor 245 may receive a transfer signal TX, a first terminal of the transfer transistor 245 may be coupled to the photodiode 220, and a second terminal of the transfer transistor 245 may be coupled to the floating diffusion node FDN. Thus, the transfer transistor 245 may transfer electric charges generated by the photodiode 220 to the floating diffusion node FDN. In the bias transistor 247, a gate terminal of the bias transistor 247 may receive a bias voltage VB, a first terminal of the bias transistor 247 may be coupled to the output terminal OUT, and a second terminal of the bias transistor 247 may be coupled to a ground voltage GND. The photodiode 220 may perform a photoelectric transformation, and may be placed between the transfer transistor 245 and the ground voltage GND.

According to operations of the unit pixel 200, the photodiode 220 transforms incident light to electric charges. The transfer transistor 245 may turn on when the transfer signal TX is input to the gate terminal of the transfer transistor 245. Thus, electric charges generated by the photodiode 220 may be transferred to the floating diffusion node FDN when the transfer signal TX is input to the gate terminal of the transfer transistor 245. The reset transistor 241 may be maintained in a turn-off state such that the electrical potential of the floating diffusion node FDN may be changed by electric charges transferred to the floating diffusion node FDN. As the electrical potential of the floating diffusion node FDN is changed, the electrical potential of the gate terminal of the source follower transistor 243 may be also changed. Then, a bias of the first terminal of the source follower transistor 243, i.e., a bias of the second terminal of the select transistor 244, may be changed. When the row selection signal RS is input to the gate terminal of the select transistor 244, an electrical signal corresponding to electric charges generated by the photodiode 220 may be output through the output terminal OUT.

After the electrical signal corresponding to electric charges generated by the photodiode 220 is detected, the reset signal RX may be input to the gate terminal of the reset transistor 241. Then, the reset transistor 241 may turn on by the reset signal RX such that a sensing process may be initialized. Although the unit pixel 200 having five-transistor structure is illustrated in FIG. 3, the structure of the unit pixel 200 is not limited thereto.

Figure 4:
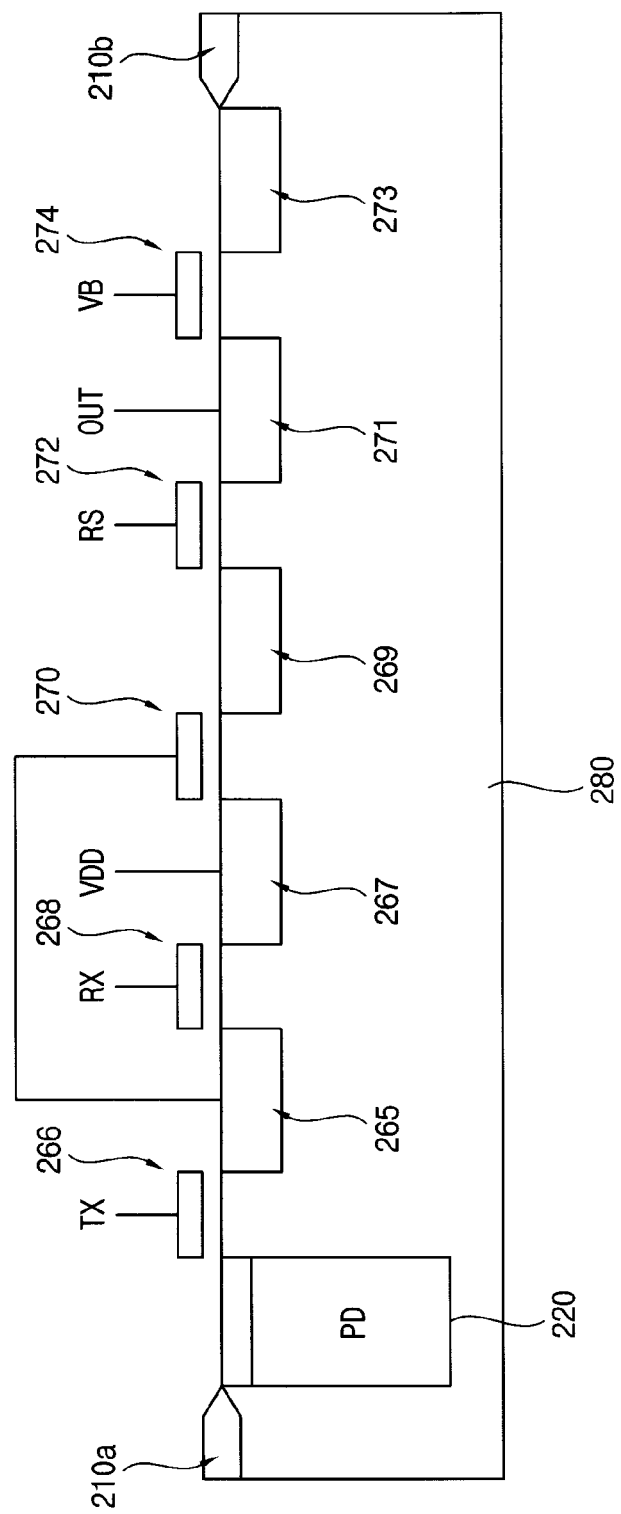
FIG. 4 illustrates a cross-sectional view of a unit pixel in a unit pixel array of FIG. 1, according to an exemplary embodiment.

FIG. 4 illustrates a cross-sectional view of an exemplary unit pixel in a unit pixel array 100 of FIG. 1.

Referring to FIG. 4, an active region of the unit pixel 200 may be defined by device isolation layers 210*a* and 210*b* on the (p)-type semiconductor substrate 280. The photodiode 220 may be formed by implanting (n)-type ions into the (p)-type semiconductor substrate 280. A first (n+)-type doped region 265 may be formed at a position that is separated from the photodiode 220 by a certain distance. The first (n+)-type doped region 265 may act as the floating diffusion node FDN for sensing the electric charges generated by the photodiode 220.

A gate terminal 266 of the transfer transistor 245 may be formed on the (p)-type semiconductor substrate 280 at a position that is between the photodiode 220 and the first (n+)-type doped region 265. A gate terminal 268 of the reset transistor 241 may be formed on the (p)-type semiconductor substrate 280 at a position that is between the first (n+)-type doped region 265 and a second (n+)-type doped region 267. A gate terminal 270 of the source follower transistor 243 may be formed on the (p)-type semiconductor substrate 280 at a position that is between the second (n+)-type doped region 267 and a third (n+)-type doped region 269. A gate terminal 272 of the select transistor 244 may be formed on the (p)-type semiconductor substrate 280 at a position that is between the third (n+)-type doped region 269 and a fourth (n+)-type doped region 271. A gate terminal 274 of the bias transistor 247 may be formed on the (p)-type semiconductor substrate 280 at a position that is between the fourth (n+)-type doped region 271 and a fifth (n+)-type doped region 273.

As described above, the transfer signal TX may be input to the gate terminal 266 of the transfer transistor 245. The reset signal RX may be input to the gate terminal 268 of the reset transistor 241. The gate terminal 270 of the source follower transistor 243 may be coupled to the first (n+)-type doped region 265. The row selection signal RS may be input to the gate terminal 272 of the select transistor 244. The bias voltage VB may be input to the gate terminal 274 of the bias transistor 247. For convenience of descriptions, insulation layers between the semiconductor substrate 280 and the gate terminals 266, 268, 270, 272, and 274 are not illustrated in FIG. 4. Although the unit pixel 200 having five-transistor structure is illustrated in FIG. 4, the structure of the unit pixel 200 is not limited thereto.

Figure 5:
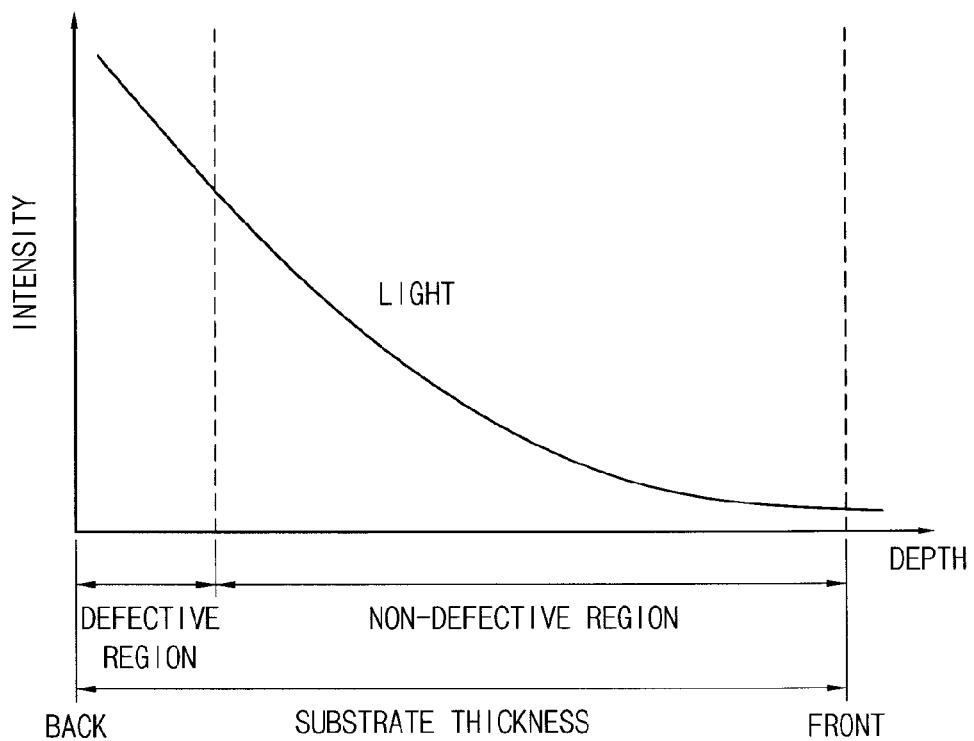
FIG. 5 illustrates a graph of signal intensity of incident light passing through a semiconductor substrate of a unit pixel array in a back-side illumination CMOS image sensor (BSI), according to an exemplary embodiment.

FIG. 5 illustrates a graph of signal intensity of incident light passing through a semiconductor substrate of a unit pixel array in a back-side illumination CMOS image sensor (BSI).

Referring to FIG. 5, in a unit pixel array of the back-side illumination CMOS image sensor, incident light passing through micro lenses and color filters may illuminate a back-side BACK of the semiconductor substrate 110. Then, incident light may pass through from the back-side BACK of the semiconductor substrate 110 to the front-side FRONT of the semiconductor substrate. As described above, when the back-side illumination CMOS image sensor is manufactured, surface defects, e.g., dangling bonds, may be caused by a grinding process performed on the back-side BACK of the semiconductor substrate. Referring to FIG. 5, the interface region that is placed near the back-side BACK of the semiconductor substrate 110 may be referred to as a defective region. On the other hand, an internal region of the semiconductor substrate 110, which excludes the interface region, may be referred to as a non-defective region.

As illustrated in FIG. 5, an intensity of incident light may become weakened as incident light passes from the back-side BACK of the semiconductor substrate 110 to the front-side FRONT of the semiconductor substrate 110. In other words, an intensity of incident light may become weakened according to the depth of the semiconductor substrate 110. An intensity of blue light having a relatively short wavelength, e.g., about 450 nm, may become weakened, e.g., drastically weakened, according to the depth of the semiconductor substrate 110. Compared to blue light, an intensity of green light having a relatively medium wavelength, e.g., about 550 nm, may gradually become weakened according to the depth of the semiconductor substrate. Compared to green light, an intensity of red light having a relatively long wavelength, e.g., about 650 nm, may gradually become weakened according to the depth of the semiconductor substrate.

As described above, since extinction coefficient of light may differ according to its wavelength, incident light filtered by different color filters may be absorbed at different positions, i.e., at different depths, of the semiconductor substrate 110. For example, blue light having a relatively short wavelength may be mostly absorbed at an upper region of the semiconductor substrate 110, green light having a relatively medium wavelength may be mostly absorbed at a center region of the semiconductor substrate 110, and red light having a relatively long wavelength may be mostly absorbed at a lower region of the semiconductor substrate 110. Therefore, blue light having a relatively short wavelength may be lost at the defective region of the semiconductor substrate 110, and red light having a relatively long wavelength may be lost at a region over the thickness of the semiconductor substrate 110, e.g., lost at a region outside the semiconductor substrate 110. As a result, light-reception efficiencies of blue light and red light may be relatively low. On the other hand, green light having a relatively medium wavelength may be mostly absorbed at the non-defective region of the semiconductor substrate 110. As a result, light-reception efficiency of green light may be relatively high. For this reason, the unit pixel array 100 of FIG. 1 may include the wavelength adjustment layer 130 that adjusts wavelengths of incident light filtered by the color filters 140 such that incident light, e.g., blue light and red light, filtered by the color filters 140 may be mostly absorbed at the non-defective region of the semiconductor substrate 110.

Figure 6:
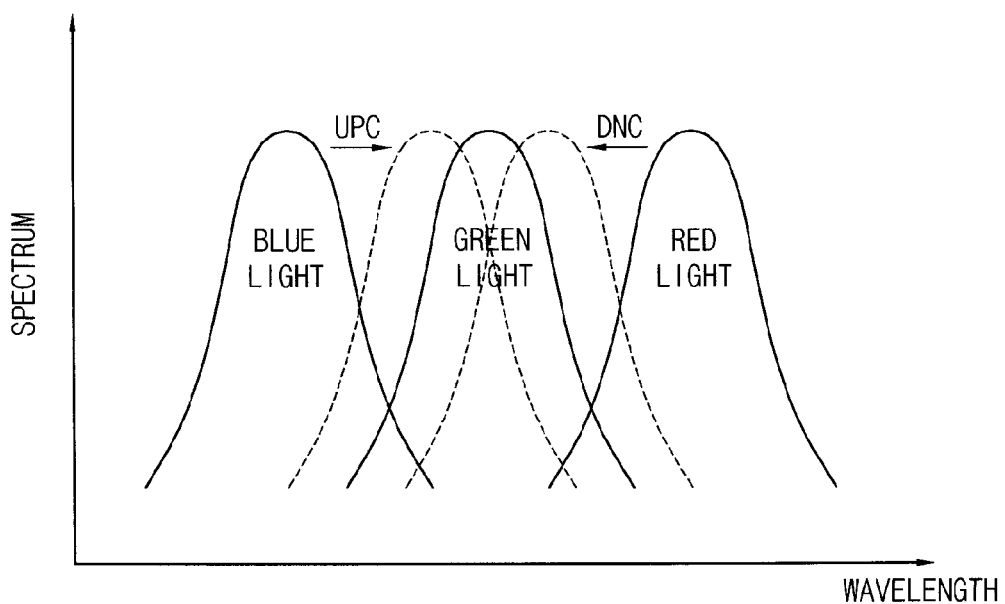
FIG. 6 illustrates a graph of adjusting wavelengths of incident light by a wavelength adjustment layer in a unit pixel array of FIG. 1, according to an exemplary embodiment.

FIG. 6 illustrates a graph of an exemplary of adjusting wavelengths of incident light by a wavelength adjustment layer in a unit pixel array of FIG. 1.

Referring to FIG. 6, the color filters 140 may include at least one red filter, at least one green filter, and at least one blue filter. The blue filter, the green filter, and the red filter may have different light-transmittance characteristics. For example, the blue filter may have a high light-transmittance characteristic for blue light having a relatively short wavelength, the green filter may have a high light-transmittance characteristic for green light having a relatively medium wavelength, and the red filter may have a high light-transmittance characteristic for red light having a relatively long wavelength. In other words, incident light filtered by the blue filter may correspond to blue light having a relatively short wavelength, incident light filtered by the green filter may correspond to green light having a relatively medium wavelength, and incident light filtered by the red filter may correspond to red light having a relatively long wavelength. As illustrated in FIG. 6, a full line indicates a distribution of incident light filtered by the color filters 140.

As described above, since blue light may be lost at the defective region of the semiconductor substrate 110, light-reception efficiency of blue light may be relatively low. In addition, since red light may be lost at the region over the thickness of the semiconductor substrate 110, light-reception efficiency of red light may be relatively low. On the other hand, since green light may be mostly absorbed at the non-defective region of the semiconductor substrate 110, light-reception efficiency of green light may be relatively high. Therefore, in the unit pixel array 100, the wavelength adjustment layer 130 may adjust wavelengths of incident light filtered by the color filters 140 such that incident light, e.g., blue light and red light, filtered by the color filters 140 may be mostly absorbed at the non-defective region of the semiconductor substrate 110.

In detail, the wavelength adjustment layer 130 may increase a wavelength of blue light (indicated as UPC in FIG. 6) such that blue light filtered by the blue filter may be mostly absorbed at the non-defective region of the semiconductor substrate 110. In addition, the wavelength adjustment layer 130 may decrease a wavelength of red light (indicated as DNC in FIG. 6) such that red light filtered by the red filter may be mostly absorbed at the non-defective region of the semiconductor substrate 110. The wavelength adjustment layer 130 may maintain a wavelength of green light such that green light filtered by the green filter may be mostly absorbed at the non-defective region of the semiconductor substrate 110. As a result, an image sensor, e.g., a CMOS image sensor, having the unit pixel array of 100, e.g., as illustrated in FIG. 1, may have improved sensing performance, e.g., light-reception efficiency and light sensitivity. That is, incident light filtered by the color filters 140 may be mostly absorbed by the photodiodes 112 formed in the semiconductor substrate 110 with minimal loss and/or without loss. Furthermore, the light-reception efficiencies of blue light, green light, and red light may be substantially equal, such that a color ratio of the image sensor may become ideal (i.e., substantially R:G:B=1:1:1).

Figure 7:
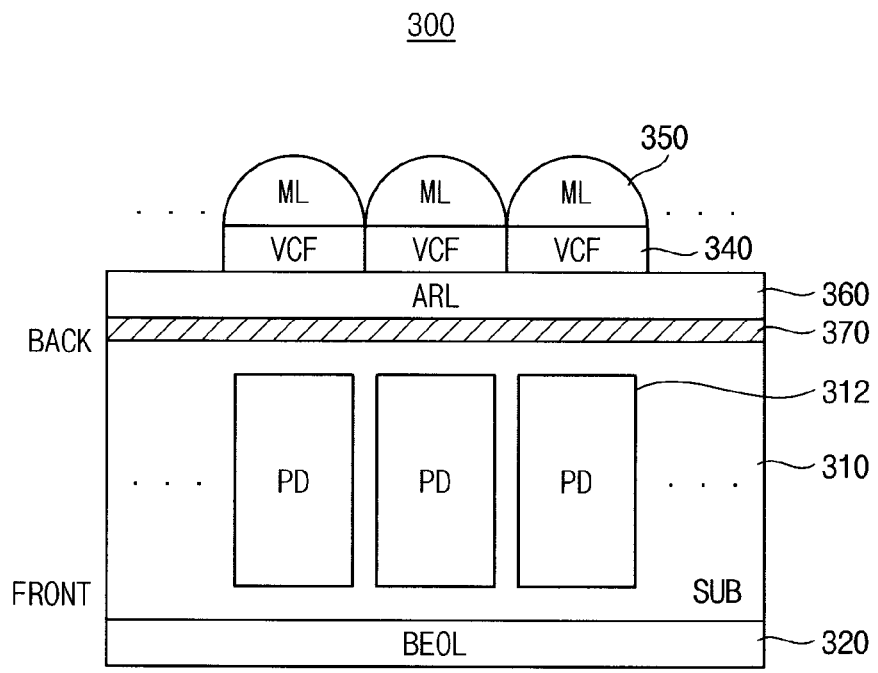
FIG. 7 illustrates a cross-sectional view of a unit pixel array of an image sensor, according to an exemplary embodiment.

FIG. 7 illustrates a cross-sectional view of a unit pixel array of an image sensor, according to an exemplary embodiment.

Referring to FIG. 7, the unit pixel array 300 of the image sensor may include a semiconductor substrate 310, an interlayer insulation layer 320 (e.g., a back end of line BEOL), a plurality of wavelength adjustment color filters 340, and a plurality of micro lenses 350. The image sensor may be a complementary metal oxide semiconductor (CMOS) image sensor. According to exemplary embodiments, the unit pixel array 300 may further include a first anti-reflection layer 360 between a back-side BACK of the semiconductor substrate 310 and the wavelength adjustment color filters 340, and/or a second anti-reflection layer (not illustrated) between a front-side FRONT of the semiconductor substrate 310 and the interlayer insulation layer 320. As illustrated in FIG. 7, in the unit pixel array 300 of FIG. 7, incident light may sequentially pass through the micro lenses 350, the wavelength adjustment color filters 340, and the back-side BACK of the semiconductor substrate 310. In this case, the CMOS image sensor having the unit pixel array 300 may be referred to as a back-side illumination CMOS image sensor (BIS).

The semiconductor substrate 310 may include a plurality of photodiodes 312 that convert incident light into electric charges. The semiconductor substrate 310 may be (p)-type epitaxial substrate. The photodiodes 312 may be formed by implanting (n)-type ions into the semiconductor substrate 310. The photodiodes 312 may be formed near a center region of the semiconductor substrate 310. In the unit pixel array 300, the photodiodes 312 corresponding to a plurality of unit pixels may be arranged in matrix manner. For example, each photodiode 312 may correspond to one wavelength adjustment color filter 340 such that the photodiodes 312 correspond to the wavelength adjustment color filters 340.

As described above, the CMOS image sensor having the unit pixel array 300 may be referred to as a back-side illumination CMOS image sensor. In a front-side illumination CMOS image sensor, incident light may illuminate a front-side of a semiconductor substrate. Thus, incident light may be reflected by obstacles such as multiple-layer metal wirings formed in an interlayer insulation layer. In addition, an optical crosstalk may occur among a plurality of photodiodes in the front-side illumination CMOS image sensor. As a result, the front-side illumination CMOS image sensor may have low sensing performance, e.g., light-reception efficiency and light sensitivity. In order to solve these problems, a back-side illumination CMOS image sensor has been suggested. However, in the back-side illumination CMOS image sensor, noises may occur due to surface defects that exist, e.g., these surface defects may be caused by a manufacturing process, in an interface region 370 of the semiconductor substrate 310.

The interlayer insulation layer 320 may be formed on the front-side FRONT of the semiconductor substrate 310. One unit pixel may include a photodiode 312 that converts incident light into electric charges, and a signal generation circuit having a plurality of transistors (not illustrated) that generate an electrical signal corresponding to the electric charges. As described above, the interlayer insulation layer 320 may include gate electrodes of the transistors and the multiple-layer metal wirings.

In some exemplary embodiments, the second anti-reflection layer may be placed between the semiconductor substrate 310 and the interlayer insulation layer 320. The second anti-reflection layer may reduce and/or prevent incident light passing through one photodiode 312 from being reflected by the interlayer insulation layer 320, i.e., near the front-side FRONT of the semiconductor substrate 310. The second anti-reflection layer may reduce and/or prevent incident light passing through one photodiode 312 from being received by other photodiodes 312 after being reflected by the interlayer insulation layer 320. As a result, the unit pixel array 300 may reduce an optical crosstalk among adjacent photodiodes 312, so that an image sensor having the unit pixel array 300 of FIG. 7 may not generate a ghost image.

The wavelength adjustment color filters 340 may be formed on the back-side BACK of the semiconductor substrate 310. The wavelength adjust color filters 340 may include therein both a plurality of color filters and a wavelength adjustment film. The wavelength adjustment film that is configured to adjust the wavelength of light, and the wavelength adjustment film may include a plurality of wavelength adjustment film portions. The wavelength adjustment color filters 340, e.g., the wavelength adjustment film of the wavelength adjustment color filters 340, may adjust wavelengths of incident light input from outside while filtering the incident light. For these operations, the wavelength adjustment color filters 340 may contain wavelength adjustment materials that adjust wavelengths of incident light. The wavelength adjustment material may be a material, e.g., an organic material, an inorganic material, etc, that receive light of a first wavelength region, and that outputs light of a second wavelength region that is different from light of the first wavelength region.

In exemplary embodiments, the wavelength adjustment color filters 340 may include at least one first wavelength adjustment color filter, at least one second wavelength adjustment color filter, and at least one third wavelength adjustment color filter. The first wavelength adjustment color filter may contain a wavelength increasing material for increasing a wavelength of incident light input from outside. The second wavelength adjustment color filter may contain a wavelength decreasing material for decreasing a wavelength of incident light input from outside. The third wavelength adjustment color filter may contain a wavelength maintaining material for maintaining a wavelength of incident light input from outside.

The wavelength adjustment color filter 340 may increase a wavelength of incident light input from outside when the incident light has a relatively short wavelength, may decrease a wavelength of incident light input from outside when the incident light has a relatively long wavelength, and may maintain a wavelength of incident light input from outside when the incident light has a relatively medium wavelength. Since an extinction coefficient of light may differ according to its wavelength, incident light filtered by different color filters may be absorbed at different positions, i.e., at different depths, in the semiconductor substrate 310. For example, blue light (e.g., incident light filtered by a blue filter) having a relatively short wavelength of about 450 nm may be mostly absorbed at an upper region of the photodiode 312, green light (e.g., incident light filtered by a green filter) having a relatively medium wavelength of about 550 nm may be mostly absorbed at a center region of the photodiode 312, and red light (e.g., incident light filtered by a red filter) having a relatively long wavelength of about 650 nm may be mostly absorbed at a lower region of the photodiode 312. Thus, in the unit pixel array 300, the wavelength adjustment color filters 340 adjusts, i.e., changes, wavelengths of incident light input from outside while filtering the incident light such that the incident light may not be absorbed at a region near the back-side BACK of the semiconductor substrate 310, and a region near the front-side FRONT of the semiconductor substrate 310.

In one exemplary embodiment, the wavelength adjustment color filters 340 may include at least one red filter, at least one green filter, and at least one blue filter. In this case, the first wavelength adjustment color filter may correspond to the blue filter, the second wavelength adjustment color filter may correspond to the red filter, and the third wavelength adjustment color filter may correspond to the green filter. The first wavelength adjustment color filter may increase a wavelength of incident light input from outside while filtering the incident light, the second wavelength adjustment color filter may decrease a wavelength of incident light input from outside while filtering the incident light, and the third wavelength adjustment color filter may maintain a wavelength of incident light input from outside while filtering the incident light. As described above, in the unit pixel array 300, the wavelength adjustment color filters 340 adjusts wavelengths of incident light, e.g., blue light, red light, and green light, such that the incident light may be mostly absorbed at the photodiode 312 that is placed in the semiconductor substrate 310.

In another exemplary embodiment, the wavelength adjustment color filters 340 may include at least one magenta filter, at least one cyan filter, and at least one yellow filter. In this case, the first wavelength adjustment color filter may correspond to the magenta filter, the second wavelength adjustment color filter may correspond to the yellow filter, and the third wavelength adjustment color filter may correspond to the cyan filter. The first wavelength adjustment color filter may increase a wavelength of incident light input from outside while filtering the incident light, the second wavelength adjustment color filter may decrease a wavelength of incident light input from outside while filtering the incident light, and the third wavelength adjustment color filter may maintain a wavelength of incident light input from outside while filtering the incident light. As described above, in the unit pixel array 300, the wavelength adjustment color filters 340 may adjust wavelengths of incident light, e.g., magenta light, yellow light, and cyan light, such that the incident light may be mostly absorbed at the photodiode 312 that is placed in the semiconductor substrate 310.

The micro lenses 350 may be formed on the wavelength adjustment color filters 340. The micro lenses 350 may correspond to the wavelength adjustment color filters 340. For example, each micro lens 350 may correspond to one wavelength adjustment color filter 340. The micro lenses 350 may concentrate incident light input from outside.

According to some exemplary embodiments, the unit pixel array 300 may further include the first anti-reflection layer 360. The first anti-reflection layer 360 may be placed between the back-side BACK of the semiconductor substrate 310 and the wavelength adjustment color filters 340. As described above, incident light may sequentially pass through the micro lenses 350, the wavelength adjustment color filters 340, and the back-side BACK of the semiconductor substrate 310. The first anti-reflection layer 360 may reduce and/or prevent incident light from being reflected by the back-side BACK of the semiconductor substrate 310. The first anti-reflection layer 360 may allow incident light to be efficiently penetrated into the semiconductor substrate 310. The first anti-reflection layer 360 may improve sensing performance, e.g., light-reception efficiency and light sensitivity, of an image sensor. For example, the first anti-reflection layer 360 may be formed by laminating a plurality of materials having different refractive indexes.

The thickness of the semiconductor substrate 310 may be gradually decreased as smaller electric device are manufactured. Nevertheless, sensing performance, e.g., light-reception efficiency and light sensitivity, of an image sensor should be improved. As described above, the unit pixel array 300 may include the wavelength adjustment color filters 340. Furthermore, the wavelength adjustment color filters 340 may increase a wavelength of incident light input from outside when the incident light has a relatively short wavelength, may decrease a wavelength of incident light input from outside when the incident light has a relatively long wavelength, and may maintain a wavelength of incident light input from outside when the incident light has a relatively medium wavelength. As a result, the unit pixel array 300 may reduce and/or prevent incident light from being absorbed near the back-side BACK of the semiconductor substrate 310 and near the front-side FRONT of the semiconductor substrate 310. Hence, the photodiode 312 that is placed at a center region of the semiconductor substrate 310 may efficiently absorb incident light. Therefore, sensing performance, e.g., light-reception efficiency and light sensitivity, of an image sensor having the unit pixel array 300 may be greatly improved.

FIGS. 8A through 8E illustrate cross-sectional views of an exemplary process of manufacturing a unit pixel array of FIG. 7.

Figure 8A:
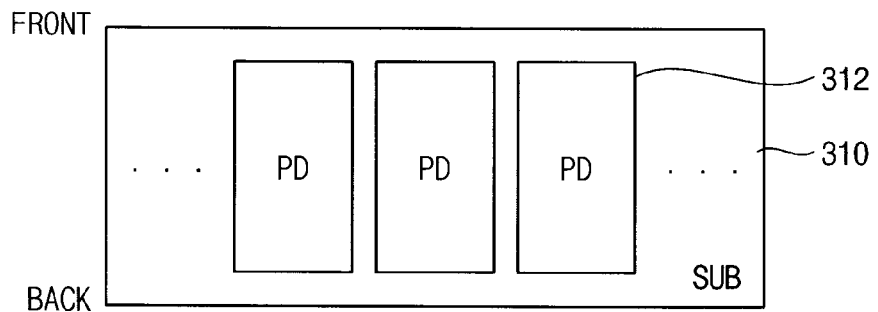
FIGS. 8A through 8E illustrate cross-sectional views of an exemplary process of manufacturing a unit pixel array of FIG. 7.

Referring to FIG. 8A, the photodiodes 312 may be formed in the semiconductor substrate 310. In some exemplary embodiments, the semiconductor substrate 310 may be the (p)-type epitaxial substrate. For example, the semiconductor substrate 310 may be manufactured by forming a (p)-type epitaxial layer on a (p)-type bulk silicon substrate. A unit pixel may transform incident light to electric charges, and may generate an electrical signal corresponding to the electric charges.

The photodiodes 312 may be arranged in the semiconductor substrate 310 in a matrix manner. For example, the photodiodes 312 may be formed by performing an ion-implantation process. The photodiodes 312 may be a (n)-type region formed in the (p)-type epitaxial layer of the semiconductor substrate 310. In some exemplary embodiments, the photodiodes 312 may be formed by laminating a plurality of doped regions. In this case, an upper doped region may be (n+)-type region that is formed by implanting (n+)-type ions in the p-type epitaxial layer of the semiconductor substrate 310, and a lower doped region may be (n−)-type region that is formed by implanting (n−)-type ions in the p-type epitaxial layer of the semiconductor substrate 310. In some exemplary embodiments, element isolation regions may be formed among a plurality of unit pixels. The element isolation regions may be formed using a field oxide (FOX) by a shallow trench isolation (STI) process or a local oxidation of silicon (LOCOS) process.

Figure 8B:
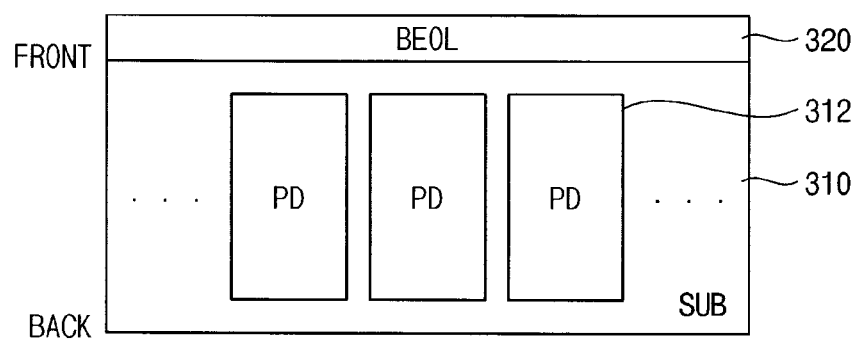

Referring to FIG. 8B, the interlayer insulation layer 320 may be formed on the front-side FRONT of the semiconductor substrate 310. The interlayer insulation layer 320 may include gate electrodes of the transistors and/or the multilayer metal wirings. The interlayer insulation layer 320 may be formed by a material having good gap-fill characteristics. For example, the material having good gap-fill characteristics may be a high density plasma (HDP), a tonen silazene (TOSZ), a spin on glass (SOG), a undoped silica glass (USG), or combinations thereof. In some exemplary embodiments, the gate electrodes included in the interlayer insulation layer 320 may be formed by laminating a gate insulation layer and a gate conductive layer on the front-side FRONT of the semiconductor substrate 310, and by patterning the gate insulation layer and the gate conductive layer laminated on the front-side FRONT of the semiconductor substrate 310. The multilayer metal wirings included in the interlayer insulation layer 320 may be formed by patterning a conductive material having a metal such as copper, aluminum, etc. In some exemplary embodiments, a protective layer (not illustrated) for protecting elements may be formed on the interlayer insulation layer 320.

Figure 8C:
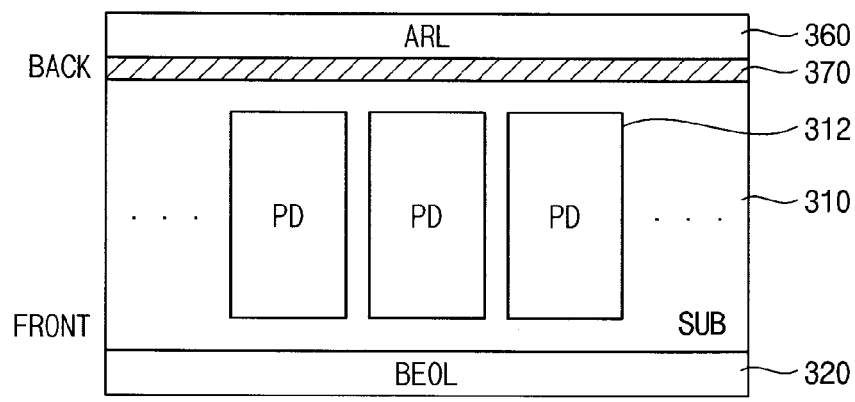

Referring to FIG. 8C, a plurality of (p)-type impurities may be heavily doped into the interface region 370 in order to passivate the surface defects such as dangling bonds after a grinding process is performed on the back-side BACK of the semiconductor substrate 310. The interface region 370 may correspond to a heavily doped region of (p)-type impurities for passivating the surface defects. The interface region 370 having the (p)-type impurities may have conductive characteristics. The grinding process may be performed on the back-side BACK of the semiconductor substrate 310 by a mechanical process and/or a chemical process. For example, the mechanical process may be performed by rubbing a polishing pad on the back-side BACK of the semiconductor substrate 310. In addition, the chemical process may be performed by injecting chemical materials such as "slurry" between a polishing pad and the back-side BACK of the semiconductor substrate 310. Then, the first anti-reflection layer 360 may be formed on the back-side BACK of the semiconductor substrate 310. As described above, the first anti-reflection layer 360 may be formed by laminating a plurality of materials having different refractive indexes. However, the first anti-reflection layer 360 may not be formed in the unit pixel array 300.

Figure 8D:
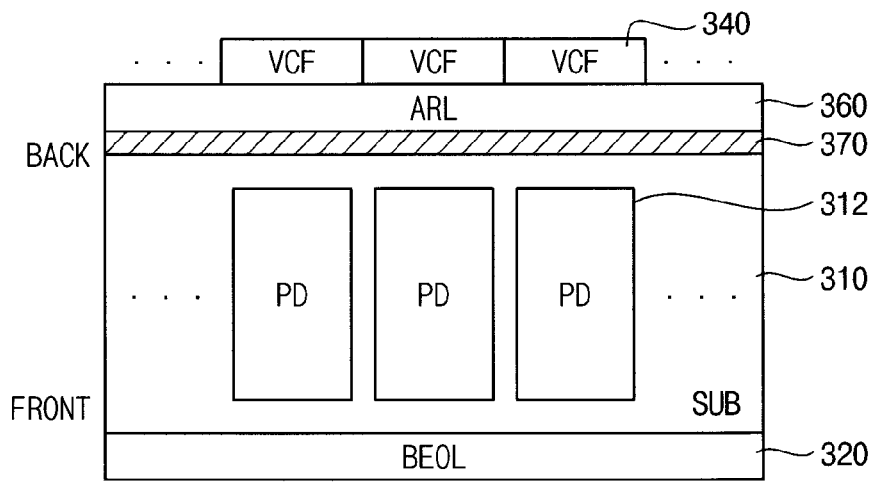

Referring to FIG. 8D, the wavelength adjustment color filters 340 may be formed on the back-side BACK of the semiconductor substrate 310, e.g., on the first anti-reflection layer 360. As described above, the wavelength adjustment color filters 340 may adjust wavelengths of incident light input from outside while filtering the incident light. For example, the wavelength adjustment color filters 340 may increase a wavelength of incident light input from outside when the incident light has a relatively short wavelength, may decrease a wavelength of incident light input from outside when the incident light has a relatively long wavelength, and may maintain a wavelength of incident light input from outside when the incident light has a relatively medium wavelength. For these operations, the wavelength adjustment color filters 340 may contain wavelength adjustment materials. The wavelength adjustment material may be a material, e.g., an organic material, an inorganic material, etc, that receives light of a first wavelength region and that outputs light of a second wavelength region that is different from light of the first wavelength region.

The wavelength adjustment color filters 340 may include at least one first wavelength adjustment color filter, at least one second wavelength adjustment color filter, and at least one third wavelength adjustment color filter. The first wavelength adjustment color filter may contain a wavelength increasing material for increasing a wavelength of incident light input from outside. The second wavelength adjustment portion may contain a wavelength decreasing material for decreasing a wavelength of incident light input from outside. The third wavelength adjustment color filter may contain a wavelength maintaining material for maintaining a wavelength of incident light input from outside. In one exemplary embodiment, the first wavelength adjustment color filter may correspond to a blue filter, the second wavelength adjustment color filter may correspond to a red filter, and the third wavelength adjustment color filter may correspond to a green filter. In another exemplary embodiment, the first wavelength adjustment color filter may correspond to a magenta filter, the second wavelength adjustment color filter may correspond to a yellow filter, and the third wavelength adjustment color filter may correspond to a cyan filter.

In some exemplary embodiments, the wavelength adjustment color filters 340 may be formed by coating the back-side BACK of the semiconductor substrate 310 with a photosensitive material, e.g., a photo-resist, and by patterning the photosensitivity material, e.g., by performing the photolithography and lithography process using masks. In some exemplary embodiments, a flat layer, e.g., an over-coating layer, may be coated on the color filters 340.

Figure 8E:
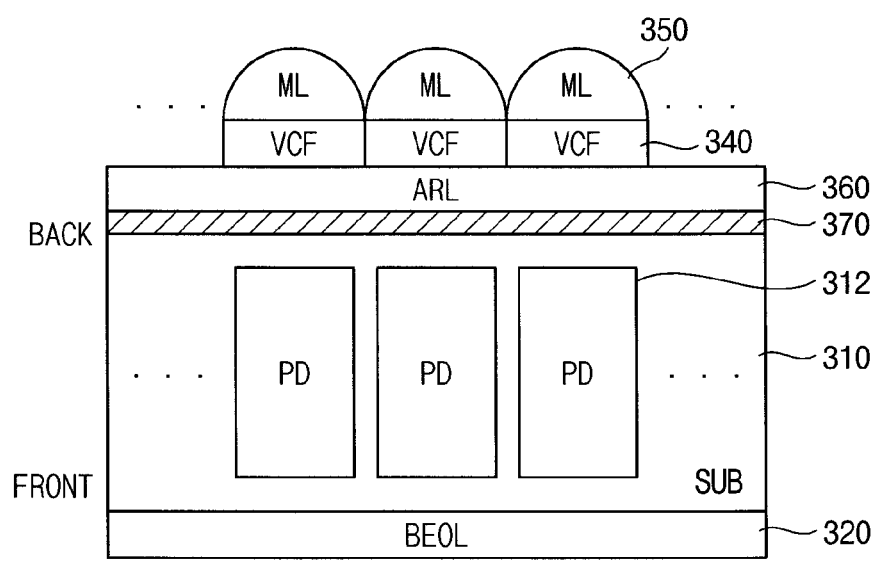

Referring to FIG. 8E, the micro lenses 350 may be formed on the wavelength adjustment color filters 340. In some exemplary embodiments, the micro lenses 350 may be formed by generating a plurality of patterns using a beam penetration photo-resist, and by performing a reflow process for the plurality of patterns. Since a manufacturing process of the unit pixel array 300 illustrated in FIGS. 8A through 8F is exemplary, the manufacturing process of the unit pixel array 300 is not limited thereto. As described above, in the unit pixel array 300, the wavelength adjustment color filters 340 may increase a wavelength of incident light input from outside when the incident light has a relatively short wavelength, may decrease a wavelength of incident light input from outside when the incident light has a relatively long wavelength, and may maintain a wavelength of incident light input from outside when the incident light has a relatively medium wavelength. Thus, the unit pixel array 300 may reduce and/or prevent incident light from being absorbed near the back-side BACK of the semiconductor substrate 310 and from being absorbed near the front-side FRONT of the semiconductor substrate 310. Hence, the photodiode 312 that is placed at the center region of the semiconductor substrate 310, may efficiently absorb incident light input from the outside. Therefore, sensing performance (e.g., light-reception efficiency and light sensitivity) of an image sensor having the unit pixel array 300 may be greatly improved.

Figure 9:
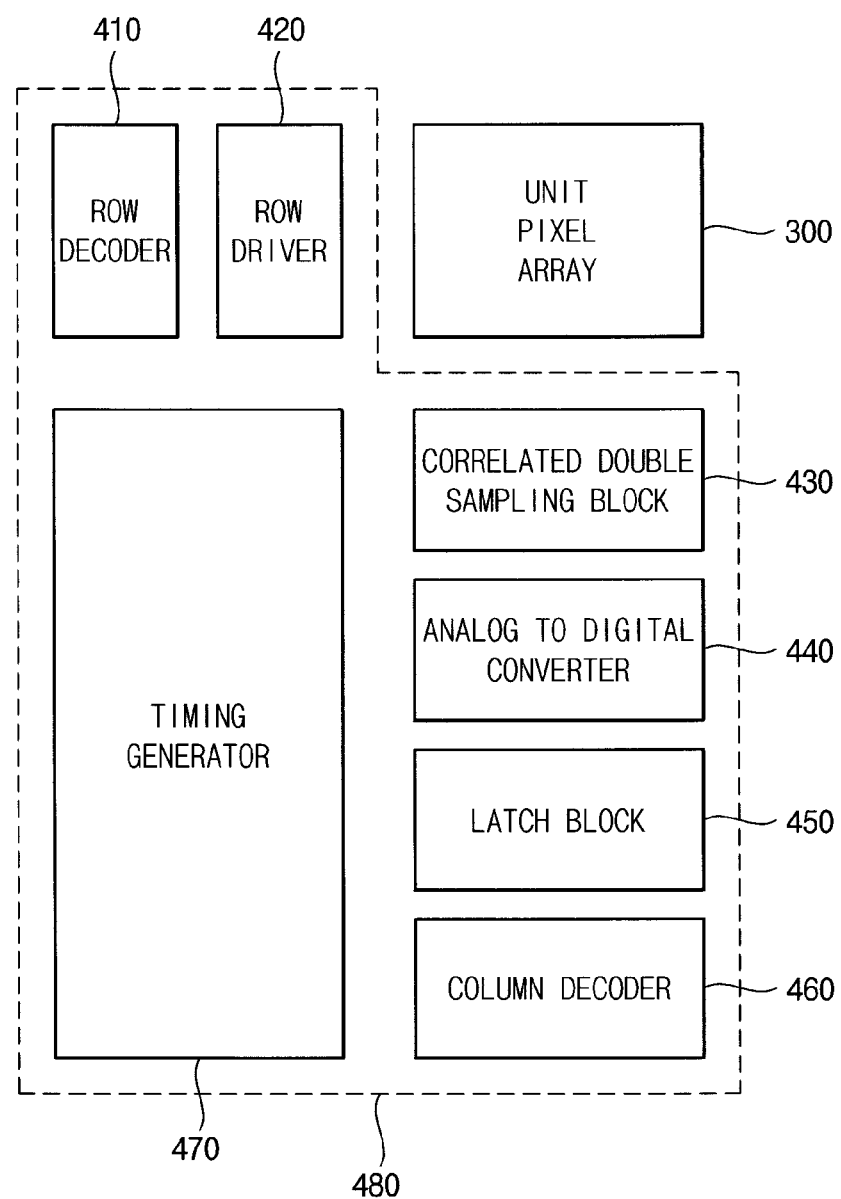
FIG. 9 illustrates a block diagram of an image sensor having a unit pixel array, according to an exemplary embodiment.

FIG. 9 illustrates a block diagram of an image sensor having a unit pixel array, according to an exemplary embodiment.

Referring to FIG. 9, the image sensor 400, e.g., a CMOS image sensor, may include the unit pixel array 100 or the unit pixel array 300, according to an exemplary embodiments. For ease of explanation, FIG. 9 illustrates the image sensor 400 with only the unit pixel array 300, which has a plurality of unit pixels arranged in a matrix manner, and a logic circuit 480 that operates the unit pixel array 300. The logic circuit 480 may include a row decoder 410, a row driver 420, a correlated double sampling block 430, an analog to digital converter 440, a latch block 450, a column decoder 460, and a timing generator 470.

The unit pixel array 100 and the unit pixel array 300 may include the unit pixels that transform incident light to an electrical signal. In one exemplary embodiment, the unit pixel array 100 may include the semiconductor substrate 110 in which the unit pixels are formed, an interlayer insulation layer 120 formed on a front-side FRONT of the semiconductor substrate 110, a wavelength adjustment layer 130 formed on a back-side BACK of the semiconductor substrate 110, a plurality of color filters 140 formed on the wavelength adjustment layer 130, and a plurality of micro lenses 150 formed on the color filters 140. The wavelength adjustment layer 130 may increase a wavelength of incident light filtered by the color filters 140 when incident light filtered by the color filters 140 has a relatively short wavelength, may decrease a wavelength of incident light filtered by the color filters 140 when incident light filtered by the color filters 140 has a relatively long wavelength, and may maintain a wavelength of incident light filtered by the color filters 140 when incident light filtered by the color filters 140 has a relatively medium wavelength. In another exemplary embodiment, the unit pixel array 300 may include a semiconductor substrate 310 in which the unit pixels are formed, an interlayer insulation layer 320 formed on a front-side FRONT of the semiconductor substrate 310, a plurality of wavelength adjustment color filters 340 formed on a back-side BACK of the semiconductor substrate 310, and a plurality of micro lenses 350 formed on the wavelength adjustment color filters 340. The wavelength adjustment color filters 340 may increase a wavelength of incident light input from outside when the incident light has a relatively short wavelength, may decrease a wavelength of incident light input from outside when the incident light has a relatively long wavelength, and may maintain a wavelength of incident light input from outside when the incident light has a relatively medium wavelength. As a result, sensing performance, e.g., light-reception efficiency and light sensitivity, of the image sensor 400 having the unit pixel array 100 or the unit pixel array 300, according to exemplary embodiments, may be greatly improved.

The timing generator 470 may provide timing signals and control signals to the row decoder 410 and the column decoder 460. The row driver 420 may provide unit pixel driving signals to the unit pixel array 300 based on a decoded result generated by the row decoder 410. In some exemplary embodiments, unit pixel driving signals may be provided to the unit pixels by each row in case that the unit pixels of the unit pixel array 300 are arranged in a matrix manner. The correlated double sampling block 430 may receive the electrical signal generated by the unit pixel array 300 via vertical signal lines, and may perform hold and sampling operations. That is, the correlated double sampling block 430 may sample a certain noise level and a level of the electrical signal to output a level difference between the certain noise level and the level of the electrical signal. Then, the analog to digital converter 440 may convert an analog signal corresponding to the level difference into a digital signal, and may output the digital signal. The latch block 450 may latch the digital signal. Subsequently, an output of the latch block 450 may be sequentially provided to an image signal processing block (not illustrated) based on a decoded result generated by the column decoder 460. However, a structure of the logic circuit 480 is not limited thereto.

Figure 10:
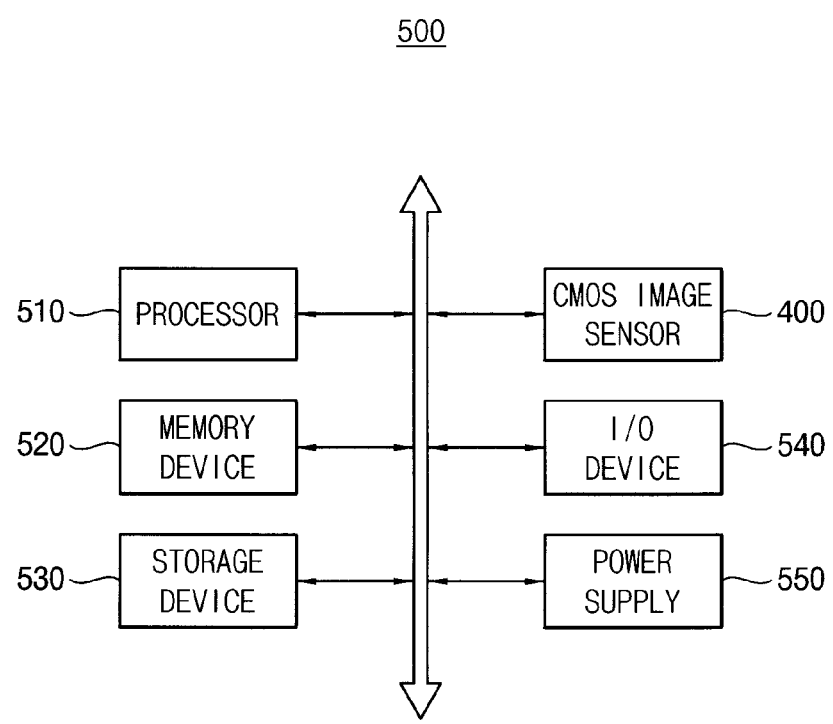
FIG. 10 illustrates a block diagram of an electric device having an image sensor of FIG. 9, according to an exemplary embodiment.

FIG. 10 illustrates a block diagram of an electric device having an image sensor 400, according to an exemplary embodiment.

Referring to FIG. 10, the electric device 500 may include a processor 510, a memory device 520, a storage device 530, an input/output (I/O) device 540, a power supply 550, and the image sensor 400. The image sensor 400 may be a CMOS image sensor, but embodiments are not limited thereto. Although not illustrated in FIG. 10, the electric device 500 may further include a plurality of ports for communicating with other components, e.g., a video card, a sound card, a memory card, a universal serial bus (USB) device, other electric devices, etc.

The processor 510 may perform various computing functions. The processor 510 may be at least one of a micro processor, a central processing unit (CPU), and etc. The processor 510 may be coupled to the memory device 520, the storage device 530, and the I/O device 540 via various buses such as an address bus, a control bus, a data bus, etc. Further, the processor 510 may be coupled to an extended bus such as a peripheral component interconnection (PCI) bus. The memory device 520 may store data for operations of the electric device 500. For example, the memory device 520 may include at least one of a dynamic random access memory (DRAM) device, a static random access memory (SRAM) device, an erasable programmable read-only memory (EPROM) device, an electrically erasable programming read-only memory (EEPROM) device, a flash memory device, etc. The storage device 530 may include a solid state drive device, a hard disk drive device, a CD-ROM device, etc. The I/O device 540 may include input devices such as a keyboard, a keypad, a mouse, etc, and output devices such as a printer, a display device, etc. The power supply 550 may provide power for operations of the electric device 500.

The image sensor 400 may communicate with the processor 510 via the buses or other communication links. In one exemplary embodiment, the image sensor 400 may include a unit pixel array, e.g., unit pixel array 100, that includes a wavelength adjustment layer that increases a wavelength of incident light filtered by the color filters when the incident light filtered by the color filters has a relatively short wavelength, that decreases a wavelength of incident light filtered by the color filters when the incident light filtered by the color filters has a relatively long wavelength, and that maintains a wavelength of incident light filtered by the color filters when the incident light filtered by the color filters has a relatively medium wavelength. In another exemplary embodiment, the image sensor 400 may include a unit pixel array, e.g., unit pixel array 300, that includes a plurality of wavelength adjustment color filters that increase a wavelength of incident light input from the outside when the incident light has a relatively short wavelength, that decrease a wavelength of incident light input from the outside when the incident light has a relatively long wavelength, and that maintain a wavelength of incident light input from the outside when the incident light has a relatively medium wavelength. As a result, sensing performance, e.g., light-reception efficiency and light sensitivity, of the image sensor 400 may be greatly improved.

In some exemplary embodiments, the image sensor 400 may be integrated with the processor 510 in one chip. For example, the electric device 500 may be a system using an image sensor such as a computer, a digital camera, a 3-D camera, a cellular phone, a personal digital assistant (PDA), a scanner, a navigation system, a video phone, a surveillance system, an auto-focusing system, a tracking system, a motion-sensing system, an image-stabilization system, etc.

Figure 11:
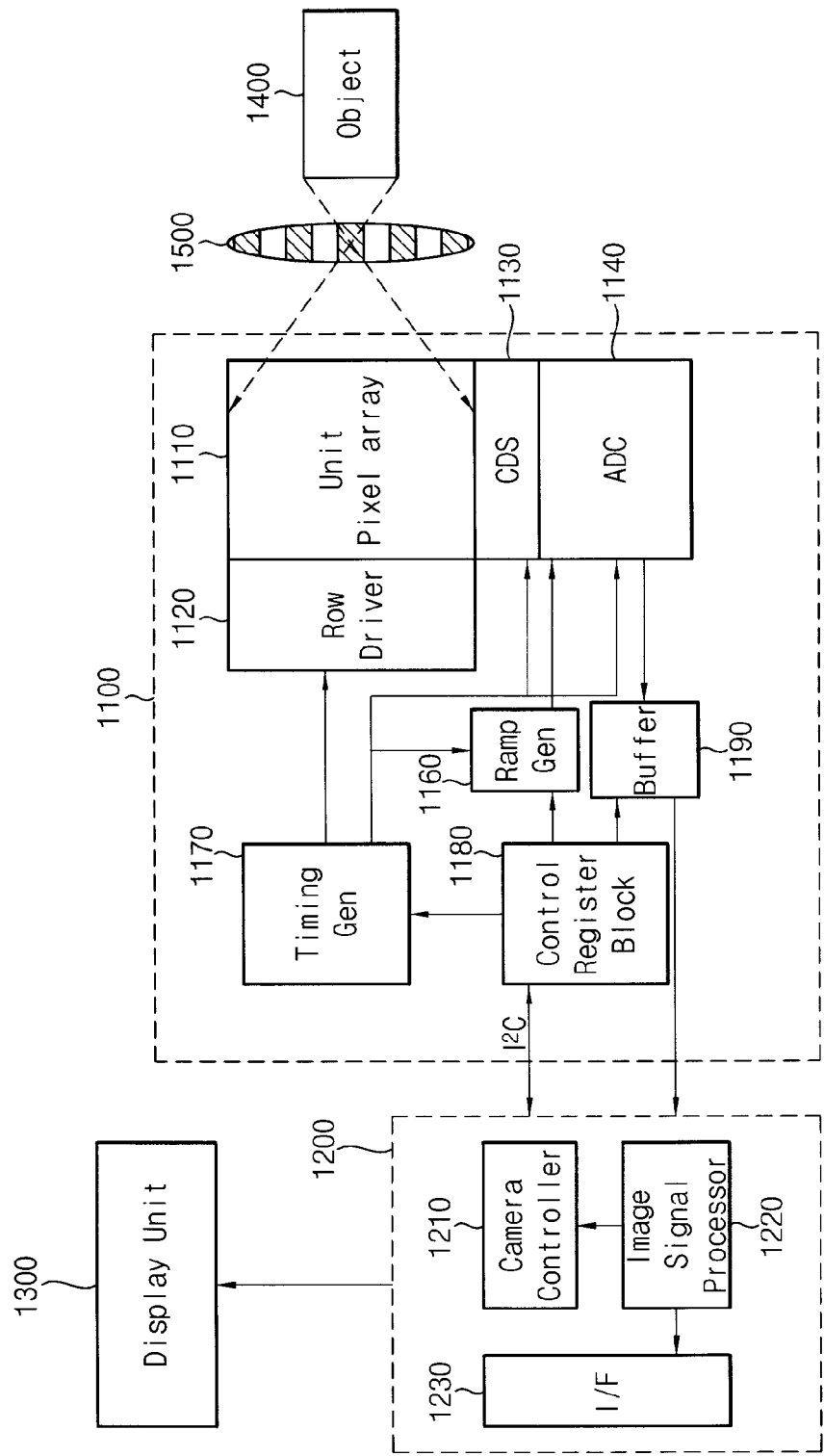
FIG. 11 illustrates a block diagram of an image sensing system, according to an exemplary embodiment.
Figure 12:
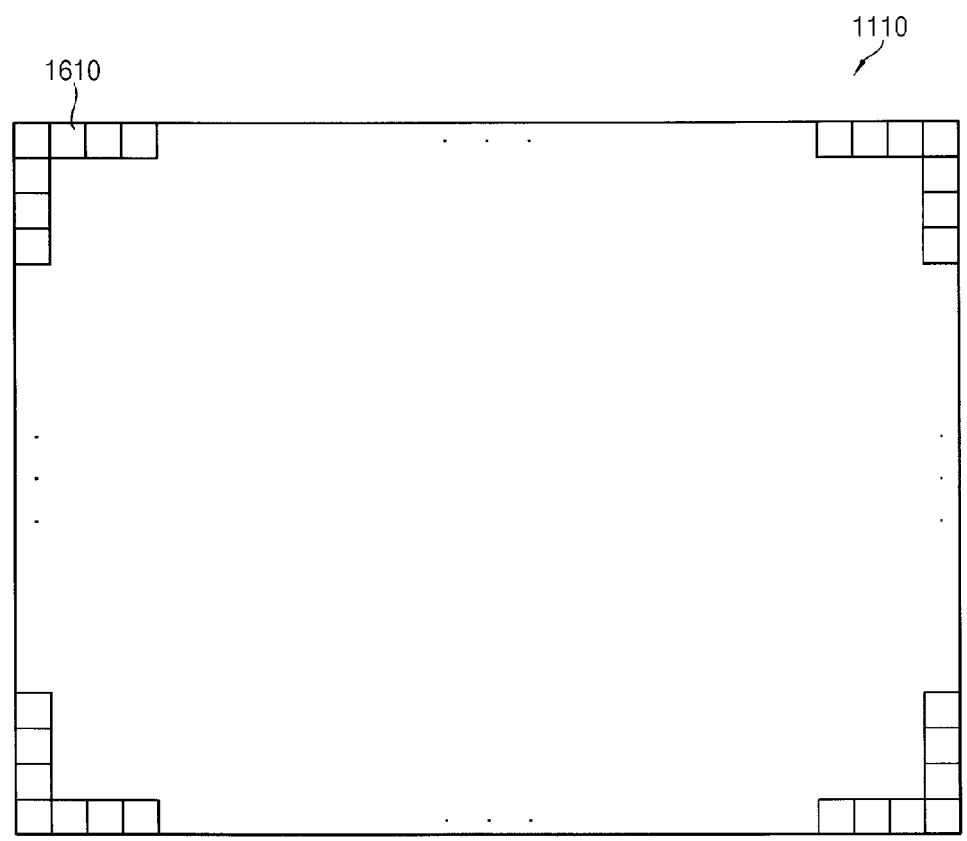
FIG. 12 illustrates a diagram of a unit pixel array in an image sensing system of FIG. 11, according to an exemplary embodiment.
Figure 13:
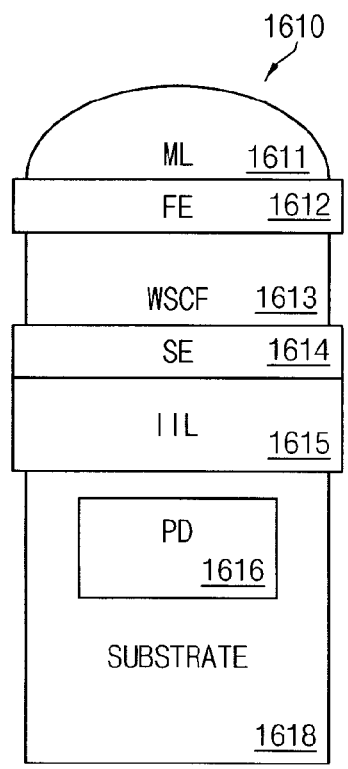
FIG. 13 illustrates a cross-sectional view of a unit pixel in a unit pixel array of FIG. 12, according to an exemplary embodiment.

FIG. 11 illustrates a block diagram of an image sensing system according to exemplary embodiments. FIG. 12 illustrates a diagram of a unit pixel array in an image sensing system of FIG. 11. FIG. 13 illustrates a cross-sectional view of a unit pixel in a unit pixel array of FIG. 12.

Referring to FIG. 11, the image sensor 1100 may include a unit pixel array 1110, a row driver 1120, a correlated double sampling block 1130, an analog to digital converter 1140, a ramp signal generator 1160, a timing generator 1170, a control register block 1180, and a buffer 1190.

Under control of a digital signal processor (DSP) 1200, the image sensor 1100 may perform sensing operations for an object 1400 that is viewed through a lens 1500. The digital signal processor 1200 may output an image generated by the image sensor 1100 to a display unit 1300. Here, the display unit 1300 may correspond to a device capable of displaying an image. For example, the display unit 1300 may be a computer, a mobile communication device, an image output terminal, etc. The digital signal processor 1200 may include a camera controller 1210, an image signal processor (ISP) 1220, and an interface (I/F) 1230. The camera controller 1210 may control a control register block 1180. For example, the camera controller 1210 may control the image sensor 1100 using an inter-integrated circuit (I2C). However, embodiments are not limited thereto.

The image signal processor 1220 may receive an image data corresponding to an output of the buffer 1190, may process an image based on the image data to display for users, and may output the image to the display unit 1300 via the interface 1230. Although it is illustrated in FIG. 11 that the image signal processor 1220 is placed in the digital signal processor 1200, the image signal processor 1220 may not be placed in the digital signal processor 1200. For example, the image signal processor 1220 may be included in the image sensor 1100. In some exemplary embodiments, the image sensor 1100 and the image signal processor 1220 may be implemented in one package, e.g., a multi-chip package (MCP).

The unit pixel array 1110 may include a plurality of unit pixels 1610. Each unit pixel may include a light sensing device, e.g., a photodiode, a pinned photodiode, etc. The image sensor 1100 may be a front-side illumination image sensor, or a back-side illumination image sensor.

Referring to FIG. 12, the unit pixel array 1110 may include a plurality of unit pixels 1610 arranged in a matrix manner. The unit pixels 1610 may receive incident light, may transform the incident light to electric charges, and may generate and output the image signal corresponding to the electric charges.

Referring to FIG. 13, according to an exemplary embodiment, each unit pixel 1610 may include a micro lens (ML) 1611, a first electrode (FE) 1612, a wavelength selection color filter (WSCF) 1613, a second electrode (SE) 1614, an interlayer insulation layer (IIL) 1615, and a semiconductor substrate (SUBSTRATE) 1618. The semiconductor substrate 1618 may include a photodiode (PD) 1616.

The micro lens 1611 may concentrate incident light input from outside. The first electrode 1612 may be placed near the micro lens 1611. The wavelength selection color filter 1613 may be placed between the first electrode 1612 and the second electrode 1614. The wavelength selection color filter 1613 may be one of color filters that allow incident light having visible ray region wavelengths to pass through, or may be one of color filters that allow incident light having infrared ray region wavelengths to pass through. For example, the wavelength selection color filter 1613 may allow incident light having visible ray region wavelengths to pass through when a bias voltage is applied to a pair of the first electrode 1612 and the second electrode 1614. According to an exemplary embodiment, the wavelength selection color filter 1613 may allow red light having a relatively long wavelength to pass through, may allow green light having a relatively medium wavelength to pass through, or may allow blue light having a relatively short wavelength to pass through.

The first electrode 1612 and the second electrode 1614 may be a transparent electrode layer. Each unit pixel 1610 may include a pair of the first electrode 1612 and the second electrode 1614. Each unit pixel 1610 may receive the bias voltage via a pair of the first electrode 1612 and the second electrode 1614. In one exemplary embodiment, the unit pixels 1610 may receive the bias voltage that is generated by the image sensor 1100. In another exemplary embodiment, the unit pixels 1610 may receive the bias voltage from the outside. The interlayer insulation layer 1615 may be formed near the second electrode 1614. The interlayer insulation layer 1615 may be an oxide layer, or may be a composite layer having an oxide layer and a nitride layer.

Figure 14:
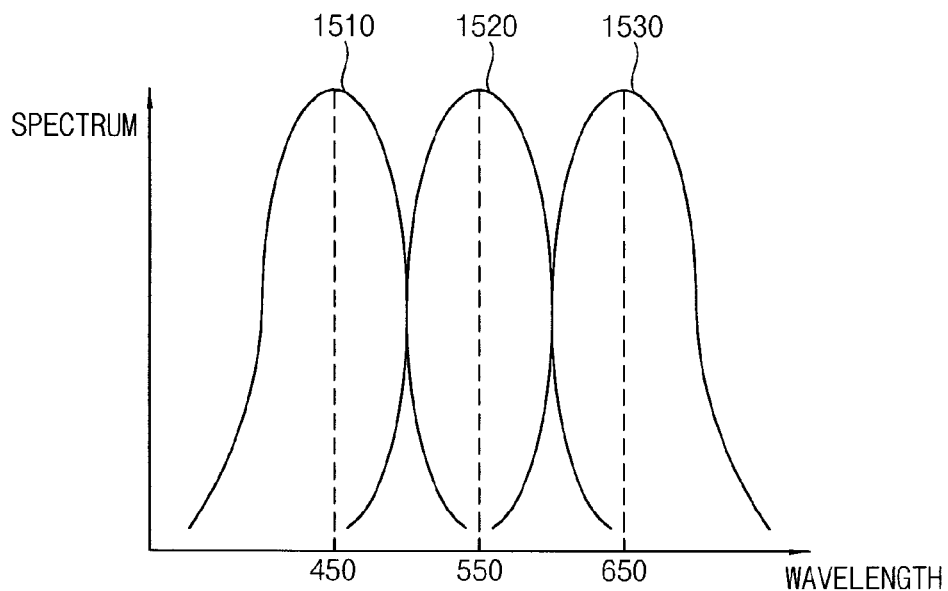
FIG. 14 illustrates a graph of visible ray region wavelengths of incident light that are absorbed by a unit pixel of FIG. 13, according to an exemplary embodiment.
Figure 15:
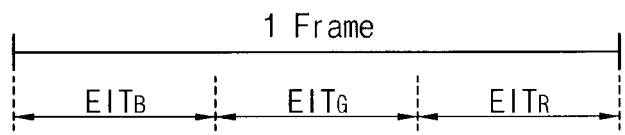
FIG. 15 illustrates a diagram of time periods used for a unit pixel of FIG. 13 to absorb incident light having visible ray region wavelengths, according to an exemplary embodiment.

FIG. 14 illustrates a graph of visible ray region wavelengths of incident light that are absorbed by a unit pixel of FIG. 13. FIG. 15 illustrates a diagram of time periods used for a unit pixel of FIG. 13 to absorb incident light having visible ray region wavelengths.

Referring to FIGS. 14 and 15, the unit pixels 1610 may absorb incident light having visible ray region wavelengths based on the bias voltage when the bias voltage is applied to a pair of the first electrode 1612 and the second electrode 1614. For example, the unit pixels 1610 may absorb incident light, e.g., blue light, having a relatively short wavelength 1510, e.g., about 450 nm, if a first bias voltage is applied to the unit pixels 1610 during a first time period $EIT_B$ of a first frame. The unit pixels 1610 may absorb incident light, e.g., green light, having a relatively medium wavelength 1520, e.g., about 550 nm, if a second bias voltage is applied to the unit pixels 1610 during a second time period $EIT_G$ of the first frame. Further, the unit pixels 1610 may absorb incident light, e.g., red light, having a relatively long wavelength 1530, e.g., about 650 nm, if a third bias voltage is applied to the unit pixels 1610 during a third time period $EIT_R$ of the first frame. In other words, according to the bias voltage applied to the unit pixels 1610, the unit pixels 1610 may operate as a plurality of unit pixels having a blue filter, may operate as a plurality of unit pixels having a green filter, or may operate as a plurality of unit pixels having a red filter. As a result, a Bayer pattern technique that includes a repeating pattern of a plurality of color filters, e.g., a blue filter, a green filter, and a red filter, may not be employed in the image sensor 1100.

Figure 16:
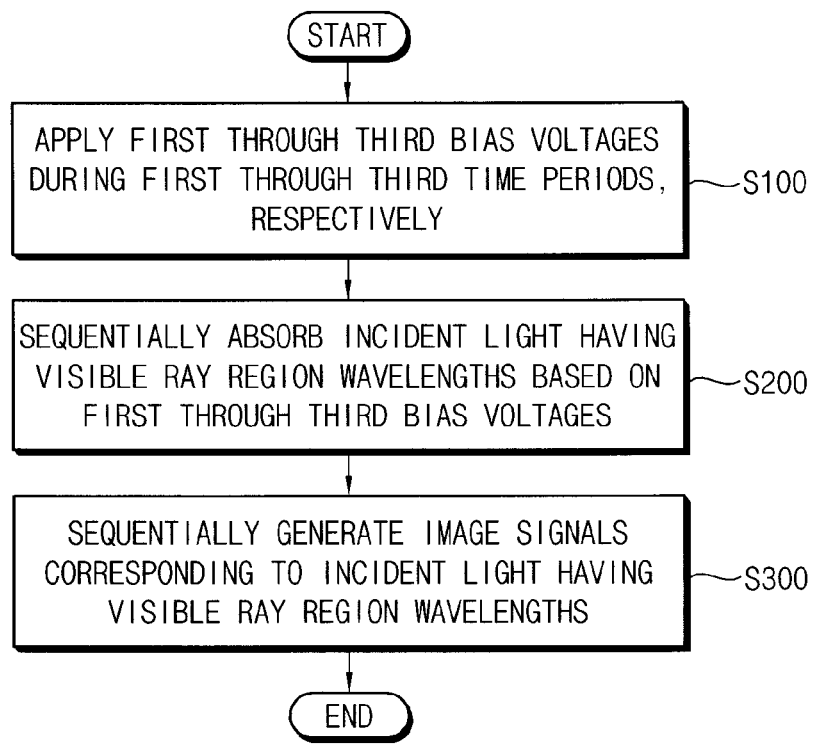
FIG. 16 illustrates a flow chart of a method of operating an image sensor, according to exemplary embodiments.

FIG. 16 illustrates a flow chart of a method of operating an image sensor according to exemplary embodiments.

Referring to FIG. 16, a first through third bias voltages may be applied to the unit pixel array 1110 of the image sensor 1100 during a first through third time periods $EIT_B$, $EIT_G$, and $EIT_R$, respectively (Step S100). During the first through third time periods $EIT_B$, $EIT_G$, and $EIT_R$, incident light having visible ray region wavelengths, e.g., blue light, green light, and red light, may be sequentially absorbed by the unit pixel array 1110 of the image sensor 1100 based on the first through third bias voltages (Step S200). For example, the unit pixel array 1110 of the image sensor 1100 may sequentially absorb incident light, e.g., blue light, having a relatively short wavelength 1510 when the first bias voltage is applied to the unit pixels 1610 during the first time period $EIT_B$, may absorb incident light, e.g., green light, having a relatively medium wavelength 1520 when the second bias voltage is applied to the unit pixels 1610 during the second time period $EIT_G$, and may absorb incident light, e.g., red light, having a relatively long wavelength 1530 when the third bias voltage is applied to the unit pixels 1610 during the third time period $EIT_R$. Then, image signals corresponding to incident light having visible ray region wavelengths, e.g., blue light, green light, and red light, may be sequentially generated by the unit pixel array 1110 of the image sensor 1100.

For example, an image signal corresponding to incident blue light having a relatively short wavelength 1510 may be generated when the first bias voltage is applied to the unit pixels 1610 during the first time period $EIT_B$. In addition, an image signal corresponding to incident green light having a relatively medium wavelength 1520 may be generated when the second bias voltage is applied to the unit pixels 1610 during the second time period $EIT_G$. Further, an image signal corresponding to incident red light having a relatively long wavelength 1530 may be generated when the third bias voltage is applied to the unit pixels 1610 during the third time period $EIT_R$.

Figure 17:
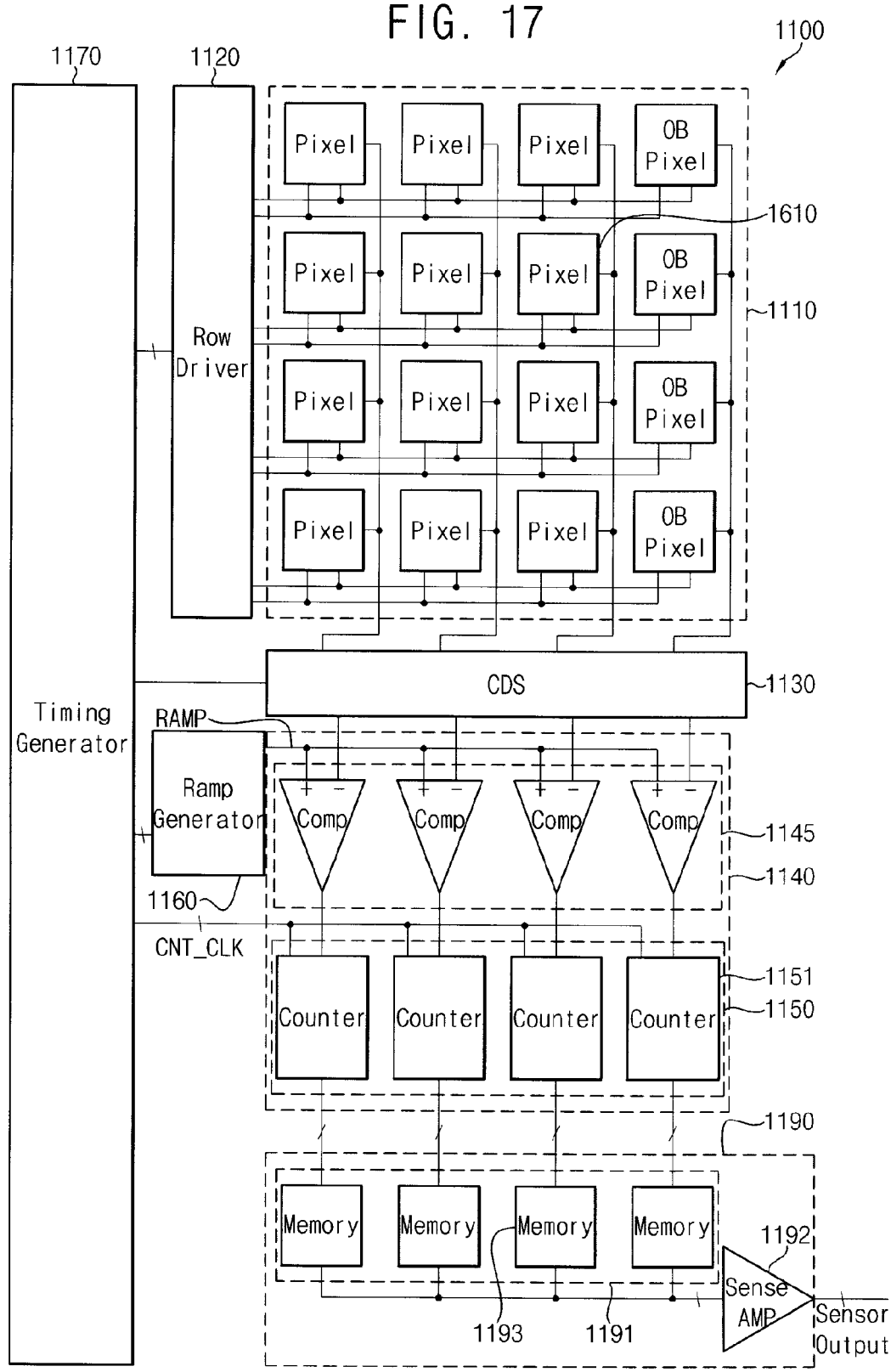
FIG. 17 illustrates a block diagram of an image sensor of FIG. 11 in detail, according to an exemplary embodiment.

FIG. 17 illustrates an exemplary block diagram of an image sensor of FIG. 11 in detail.

Referring to FIG. 17, the timing generator 1170 may control the row driver 1120, the analog to digital converter 1140, and the ramp signal generator 1160 by providing a plurality of control signals to the row driver 1120, the analog to digital converter 1140, and the ramp signal generator 1160. The control register block 1180 may control the ramp signal generator 1160, the timing generator 1170, and the buffer 1190 by providing a plurality of control signals to the ramp signal generator 1160, the timing generator 1170, and the buffer 1190. The control register block 1180 may be controlled by the camera controller 1210. The row driver 1120 may control the unit pixel array 1110 to operate by each row. The unit pixel array 1110 may include a plurality of OB pixels. The For example, the row driver 1120 may generate row selection signals. Each unit pixel 1610 may receive incident light input from the outside, and may output an image signal and an image reset signal to the correlated double sampling block 1130. The correlated double sampling block 1130 may perform correlated double sampling operations on the image signal and the image reset signal. In some exemplary embodiments, the correlated double sampling block 1130 may perform correlated double sampling operations on an optical black signal and an optical black reset signal. The analog to digital converter 1140 may generate a comparison signal by comparing a ramp signal Ramp output from the ramp signal generator 1160 with a correlated double sampling signal output from the correlated double sampling block 1130, and may count the comparison signal based on a clock signal CNT_CLK to output a count value to the buffer 1190.

Referring to FIG. 17, the analog to digital converter 1140 may include a comparison block 1145 and a counter block 1150. The comparison block 1145 may include a plurality of comparators Comp. Each comparator Comp may be coupled to both of the correlated double sampling block 1130 and the ramp signal generator 1160. The correlated double sampling block 1130 may be coupled to a first input terminal of each comparator Comp, and the ramp signal generator 1160 may be coupled to a second input terminal of each comparator Comp. Each comparator Comp may receive an output signal generated by the correlated double sampling block 1130 and an output signal generated by the ramp signal generator 1160. Each comparator Comp may compare the output signal generated by the correlated double sampling block 1130 with the output signal generated by the ramp signal generator 1160, and may output the comparison signal via its output terminal. For example, a comparison signal generated by a first comparator may correspond to a difference between an image signal and an image reset signal. The ramp signal may be used to output the difference between the image signal and the image reset signal. The difference between the image signal and the image reset signal may be output based on a slope of the ramp signal. The ramp signal generator 1160 may operate based on a control signal output from the timing generator 1170.

The counter block 1150 may include a plurality of counters 1151. Each counter 1151 may be coupled to the output terminal of each comparator Comp. Each counter 1151 may output a digital signal by counting the comparison result signal based on the clock signal CNT_CLK output from the timing generator 1170. Here, the clock signal CNT_CLK may be controlled by a counter control signal generated by the timing generator 1170. For example, the clock signal CNT_CLK may be generated by a counter controller of the timing generator 1170. Each counter 1151 may be implemented by a UP/DOWN counter, or by a BIT-WISE inversion counter. The BIT-WISE counter may operate similarly to the UP/DOWN counter.

The buffer 1190 may temporarily store a plurality of digital image signals output from the analog to digital converter 1140, may sense and amplify the digital image signals, and may output the amplified digital image signals. The buffer 1190 may include a memory block 1191 and a sense amplifier 1192. The memory block 1191 may include a plurality of memory devices 1193 for storing count-values output from the counters 1151, respectively. The memory block 1191 may temporarily store the digital image signals output from the counters 1151, and may output the digital image signals to the sense amplifier 1192. The sense amplifier 1192 may sense and amplify the digital image signals to output the amplified digital image signals.

Figure 18:
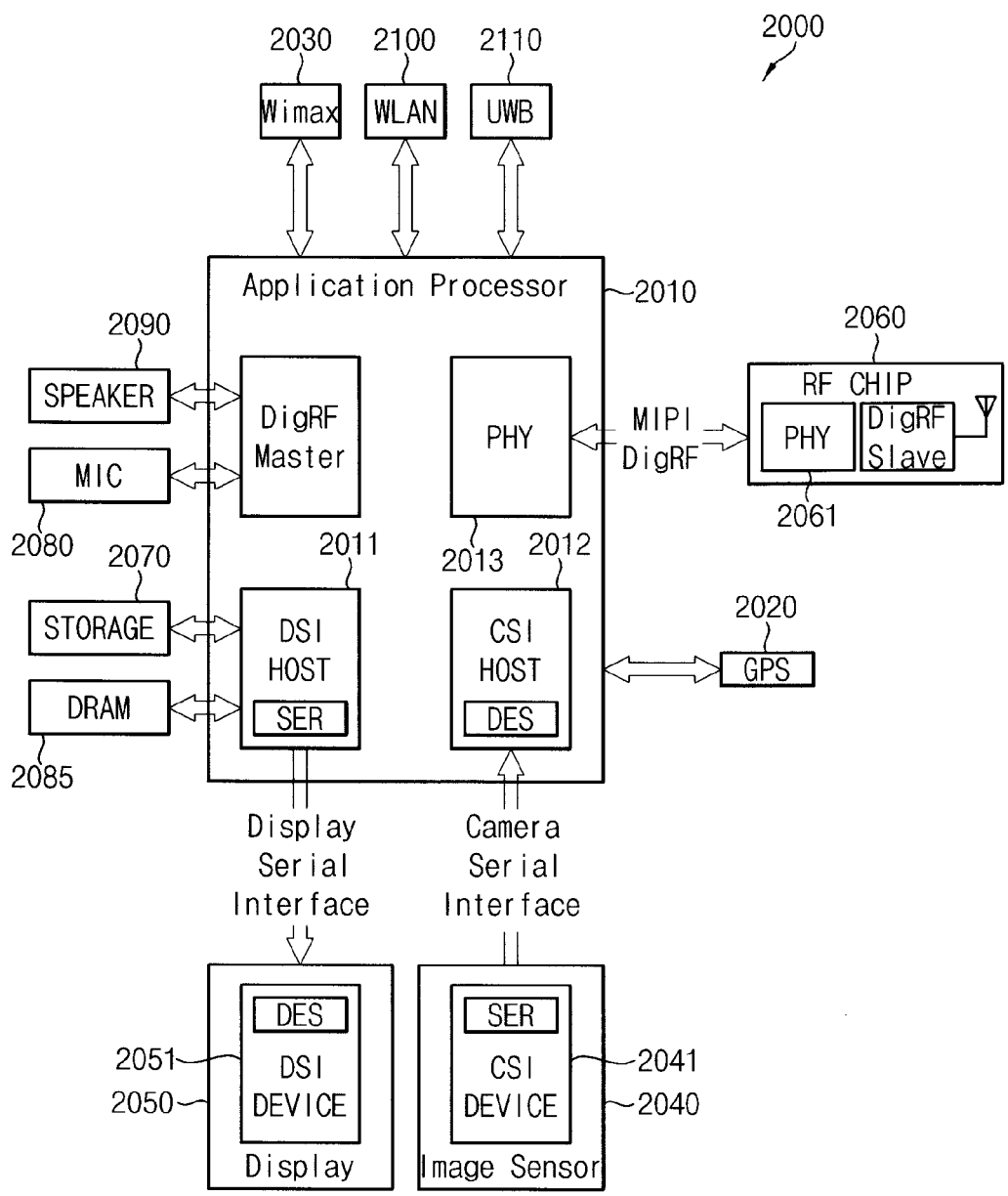
FIG. 18 illustrates a block diagram of an image sensing system, according to an exemplary embodiment.

FIG. 18 illustrates a block diagram of an image sensing system according to exemplary embodiments.

Referring to FIG. 18, the image sensing system 2000 may be implemented by using a data processing device that uses, or supports a mobile industry processor interface (MIPI) interface, e.g., a mobile phone, a personal digital assistant (PDA), a portable multimedia player (PMP), a smart phone, etc. The image sensing system 2000 may include an application processor 2010, an image sensor 2040, a display device 2050, etc.

A CSI host 2012 of the application processor 2010 may perform a serial communication with a CSI device 2041 of the image sensor 2040 using a camera serial interface (CSI). In some exemplary embodiments, the CSI host 2012 may include a light deserializer (DES), and the CSI device 2041 may include a light serializer (SER). The image sensor 2040 may correspond to the image sensor 1100 of FIG. 17. A DSI host 2011 of the application processor 2010 may perform a serial communication with a DSI device 2051 of the display device 2050 using a display serial interface (DSI). In some exemplary embodiments, the DSI host 2011 may include a light serializer (SER), and the DSI device 2051 may include a light deserializer (DES).

The image sensing system 2000 may further include a radio frequency (RF) chip 2060. The RF chip 2060 may perform a communication with the application processor 2010. The RF chip 2060 may include a physical layer (PHY) 2013 and a DigRF Slave. A physical layer (PHY) 2013 of the image sensing system 2000 and the physical layer (PHY) 2061 of the RF chip 2060 may perform data communications based on a MIPI DigRF. The image sensing system 2000 may further include a global positioning system (GPS) 2020, a storage 2070, a MIC 2080, a DRAM device 2085, and a speaker 2090. The speaker 2090 and the MIC 2080 may perform data communications with the DigRF Master in the application processor 2010. The image sensing system 2000 may perform communications using an ultra wideband (UWB) 2110, a wireless local area network (WLAN) 2100, a worldwide interoperability for microwave access (WIMAX) 2030, and/or etc. However, the structure and the interface of the image sensing system 2000 are not limited thereto.

As described above, embodiments may be applied to an image sensor, and an electric device having the image sensor. For example, the electric device may be a system using an image sensor such as a computer, a digital camera, a 3-D camera, a cellular phone, a personal digital assistant (PDA), a scanner, a navigation system, a video phone, a surveillance system, an auto-focusing system, a tracking system, a motion-sensing system, an image-stabilization system, etc.

By way of summation and review, an image sensor may employ a Bayer pattern technique that uses a plurality of color filters. The color filters may allow incident light having a specific wavelength, i.e., color, to pass therethrough. As discussed above, since incident light having different wavelengths have different transmittances with respect to a semiconductor substrate of an image sensor, the incident light having different wavelengths may be absorbed at different locations, i.e., at different depths, in the semiconductor substrate.

Embodiments, e.g., the exemplary embodiments discussed above, relate to a unit pixel array of an image sensor. Some exemplary embodiments provide a unit pixel array of an image sensor capable of adjusting, e.g., changing, wavelengths of incident light to improve sensing performance, e.g., light-reception efficiency and light sensitivity, of the image sensor. Therefore, a unit pixel array of an image sensor according to example embodiments may adjust wavelengths of incident light so that a plurality of photodiodes formed in a semiconductor substrate of the image sensor may efficiently absorb the incident light. As a result, the image sensor may have high sensing performance so that the image sensor may generate a high-quality image.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, all such modifications are intended to be included within the scope of the present inventive concept as defined in the claims. It is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A unit pixel array of an image sensor, comprising:
a semiconductor substrate having a plurality of photodiodes;
an interlayer insulation layer on a front-side of the semiconductor substrate;
a plurality of micro lenses on a back-side of the semiconductor substrate;
a plurality of wavelength adjustment film portions between respective ones of the micro lenses and the back-side of the semiconductor substrate; and
a plurality of color filters including a first color filter to output light to a first wavelength adjustment film portion and a second color filter to output light to a second wavelength adjustment film portion, wherein:
a first wavelength adjustment film portion changes a wavelength of light from the first color filter such that a majority of light from the first color filter is absorbed by a predetermined amount at a first depth of the semiconductor substrate, and
a second wavelength adjustment film portion changes a wavelength of light from the second color filter such that a majority of light from the second color filter is absorbed by the predetermined amount at the first depth of the substrate, wherein the first and second color filters filter light of different colors.

2. The unit pixel array as claimed in claim 1, wherein the color filters are on respective ones of the plurality of wavelength adjustment film portions, and wherein the plurality of micro lenses are on respective ones of the color filters.

3. The unit pixel array as claimed in claim 1, wherein the wavelength adjustment film portions include:
the first wavelength adjustment film portion has a wavelength increasing material that increases the wavelength of light from the first color filter;
the second wavelength adjustment film portion has a wavelength decreasing material that decreases the wavelength of light from the second color filter,
a third wavelength adjustment film portion has a wavelength maintaining material that substantially maintains a wavelength of light from a third color filter such that a majority of light from the third color filter is absorbed by the predetermined amount at the first depth of the substrate, the third color filter filtering light of a color different from the first and second color filters the wavelengths of incident light filtered the color filter.

4. The unit pixel array as claimed in claim 3, wherein the plurality of color filters includes at least one red filter, at least one green filter, and at least one blue filter.

5. The unit pixel array as claimed in claim 4, wherein the blue filter is on the first wavelength adjustment portion, the green filter is on the second wavelength adjustment portion, and the red filter is on the third wavelength adjustment portion.

6. The unit pixel array as claimed in claim 3, wherein the plurality of color filters includes at least one yellow filter, at least one cyan filter, and at least one magenta filter.

7. The unit pixel array as claimed in claim 6, wherein the magenta filter is on the first wavelength adjustment portion, the yellow filter is on the second wavelength adjustment portion, and the cyan filter is on the third wavelength adjustment portion.

8. The unit pixel array as claimed in claim 1, wherein:
the first color film passes a first wavelength of light,
the second color film passes a second wavelength of light less than the first wavelength of light,
the first wavelength adjustment film portion decreases the first wavelength of light by a first amount, and
the second wavelength adjustment film portion increases the second wavelength of light by a second amount.

9. The unit pixel array as claimed in claim 8, wherein the first amount is different from the second amount.

10. The unit pixel array as claimed in claim 1, wherein the first depth corresponds to a region of the semiconductor substrate having the photodiodes therein.

11. A unit pixel array of an image sensor, comprising:
a semiconductor substrate having a plurality of photodiodes;
an interlayer insulation layer on a front-side of the semiconductor substrate;
a plurality of micro lenses on a back-side of the semiconductor substrate; and
a plurality of wavelength adjustment film portions between respective ones of the micro lenses and the back-side of the semiconductor substrate, wherein the plurality of wavelength adjustment film portions are wavelength adjustment color filters on the back-side of the semiconductor substrate, and wherein:
the plurality of micro lenses are on respective ones of the wavelength adjustment color filters, and
a first wavelength adjustment color filter changes a wavelength of light received from a first one of the micro lenses so that a majority of the changed wavelength of light from the first wavelength adjustment color filter is absorbed at a first depth of the substrate, and
a second wavelength adjustment color filter changes a wavelength of light received from a second one of the micro lenses so that a majority of the changed wavelength of light from the second wavelength adjustment color filter is absorbed at the first depth of the substrate, wherein the first and second wavelength adjustment color filters are of different colors.

12. The unit pixel array as claimed in claim 11, wherein:
the first wavelength adjustment color filter has a wavelength increasing material that increases the wavelengths of incident light;
the second wavelength adjustment color filter has a wavelength decreasing material that decreases the wavelengths of incident light; and
a third wavelength adjustment color filter has a wavelength maintaining material that maintains a wavelength of incident light received from a third one of the micro lenses, the third wavelength adjustment color filter filtering light of a color different from the first and second wavelength adjustment color filters.

13. The unit pixel array as claimed in claim 12, wherein the first wavelength adjustment color filter corresponds to a blue filter, the second wavelength adjustment color filter corresponds to a red filter, and the third wavelength adjustment color filter corresponds to a green filter.

14. The unit pixel array as claimed in claim 12, wherein the first wavelength adjustment color filter corresponds to a magenta filter, the second wavelength adjustment color filter corresponds to a yellow filter, and the third wavelength adjustment color filter corresponds to a cyan filter.

15. The unit pixel array as claimed in claim 11, wherein:
the first wavelength adjustment color filter receives a first wavelength of light and outputs a second wavelength of light, the second wavelength of light decreased relative to the first wavelength of light by a first amount,
the second wavelength adjustment color filter receives a third wavelength of light and outputs a fourth wavelength of light, the fourth wavelength of light increased relative to the third wavelength of light by a second amount.

16. The unit pixel array as claimed in claim 15, wherein the first amount is different from the second amount.

17. The unit pixel array as claimed in claim 11, wherein the first depth corresponds to a region of the semiconductor substrate having the photodiodes therein.

18. An image sensing system including an image sensor, the image sensing system comprising:
a semiconductor substrate having a plurality of photodiodes of the image sensor;
an interlayer insulation layer on a front-side of the semiconductor substrate;
a plurality of micro lenses of the image sensor on a back-side of the semiconductor substrate, the micro lenses facing an outside of the image sensing system; and
a wavelength adjustment film portion between each of the micro lenses and the back-side of the semiconductor substrate such that a plurality of wavelength adjustment film portions correspond with the plurality of micro lenses, the wavelength adjustment film portions adjusting wavelengths of incident light input therein from the outside of the image sensing system, wherein the wavelength adjustment film portions include:
a plurality of first wavelength adjustment portions having a wavelength increasing material that increases the wavelengths of incident light input therein from the outside of the image sensing system, the wavelengths increased to be absorbed by a predetermined amount at a first depth of the substrate;
a plurality of second wavelength adjustment portions having a wavelength decreasing material that decreases the wavelengths of incident light input therein from the outside of the image sensing system, the wavelengths decreased to be absorbed by the predetermined amount at a first depth of the substrate; and
a plurality of third wavelength adjustment portions having a wavelength maintaining material that substantially maintains the wavelengths of incident light input therein from the outside of the image sensing system, the wavelengths maintained to be absorbed by the predetermined amount at the first depth of the substrate.

* * * * *